(12) United States Patent
Umeno et al.

(10) Patent No.: US 8,771,415 B2
(45) Date of Patent: Jul. 8, 2014

(54) METHOD OF MANUFACTURING SILICON SINGLE CRYSTAL, SILICON SINGLE CRYSTAL INGOT, AND SILICON WAFER

(75) Inventors: Shigeru Umeno, Tokyo (JP); Keiichiro Hiraki, Tokyo (JP); Hiroaki Taguchi, Tokyo (JP)

(73) Assignee: Sumco Corporation, Tokyo (JP)

(*) Notice: Subject to any disclaimer, the term of this patent is extended or adjusted under 35 U.S.C. 154(b) by 1135 days.

(21) Appl. No.: 12/604,627

(22) Filed: Oct. 23, 2009

(65) Prior Publication Data

US 2010/0111802 A1    May 6, 2010

(30) Foreign Application Priority Data

Oct. 27, 2008  (JP) ................................. 2008-276016
Nov. 11, 2008  (JP) ................................. 2008-288326

(51) Int. Cl.
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |
| C01B 33/02 | (2006.01) |

(52) U.S. Cl.
USPC ............................................ 117/13; 423/348

(58) Field of Classification Search
USPC ................. 117/13–15, 20; 423/325, 348–350
See application file for complete search history.

(56) References Cited

U.S. PATENT DOCUMENTS

| 6,190,452 B1 * | 2/2001 | Sakurada et al. ............... 117/20 |
| 6,337,219 B1 | 1/2002 | Nishikawa |
| 2009/0302432 A1 | 12/2009 | Ono |

FOREIGN PATENT DOCUMENTS

| JP | 2000-058509 | 2/2000 |
| JP | 2005-194186 | 7/2005 |
| JP | 2007-123542 | 5/2007 |
| JP | 2007-123543 A * | 5/2007 ........... G01N 21/956 |
| JP | 2007-123543 A | 5/2007 |
| JP | 2007-261935 | 10/2007 |
| JP | 2007-261935 A | 10/2007 |
| KR | 10-2002-0081370 | 10/2002 |
| WO | 99/40243 | 8/1999 |

OTHER PUBLICATIONS

Japanese Office Action dated Aug. 28, 2012 in related Application No. 2008-276016 (and partial English translation thereof).
Korean Office Action in related Application No. 10-2009-0102206 (and partial English translation thereof). Mail on date May 31, 2012.

* cited by examiner

*Primary Examiner* — Anthony J Zimmer
(74) *Attorney, Agent, or Firm* — Greenblum & Bernstein, P.L.C.

(57) ABSTRACT

By determining a control direction of a pulling-up velocity without using a position or a width of an OSF region as an index, a subsequent pulling-up velocity profile is fed back and adjusted. A silicon single crystal ingot that does not include a COP and a dislocation cluster is grown by a CZ method, a silicon wafer is sliced from the silicon single crystal ingot, reactive ion etching is performed on the silicon wafer in an as-grown state, and a grown-in defect including silicon oxide is exposed as a protrusion on an etching surface. A growing condition in subsequent growing is fed back and adjusted on the basis of an exposed protrusion generation region. As a result, feedback with respect to a nearest batch can be performed without performing heat treatment to expose a defect.

11 Claims, 14 Drawing Sheets

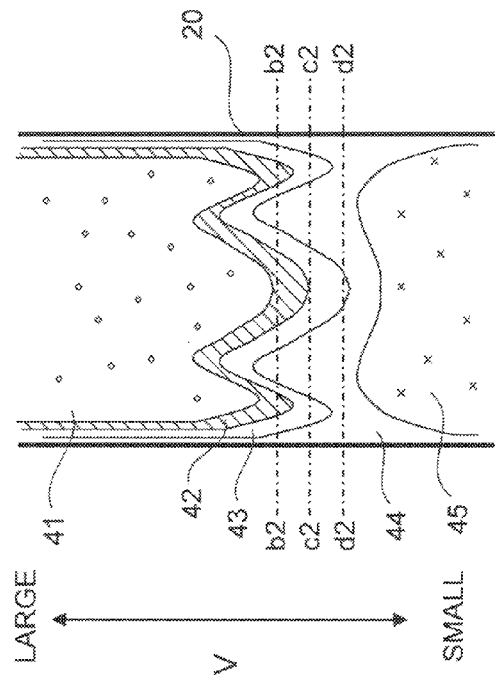
FIG.3A
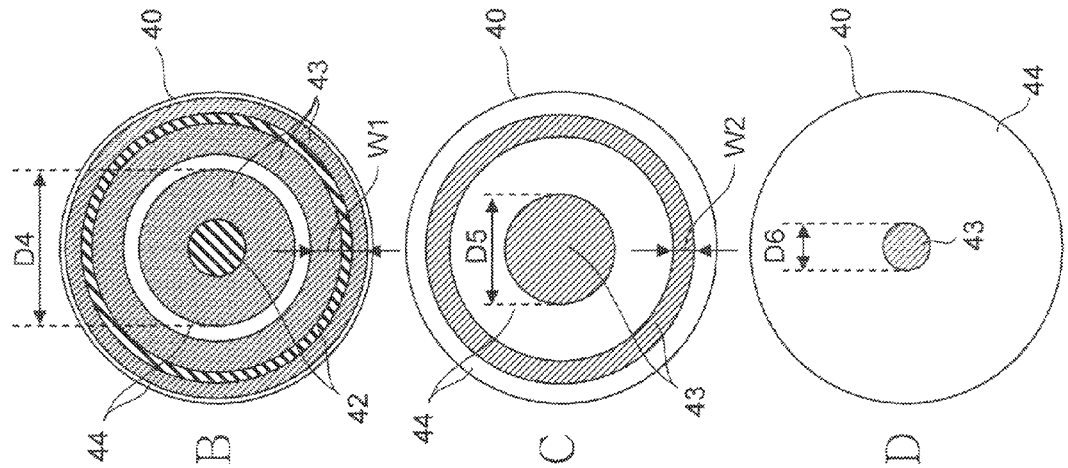
FIG.3B
FIG.3C
FIG.3D

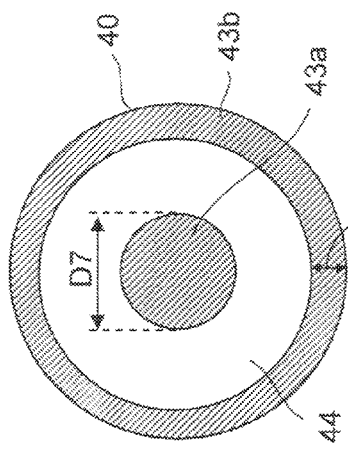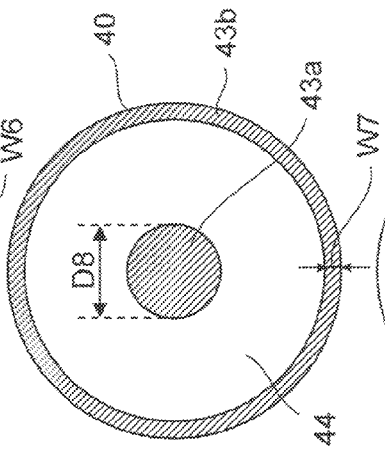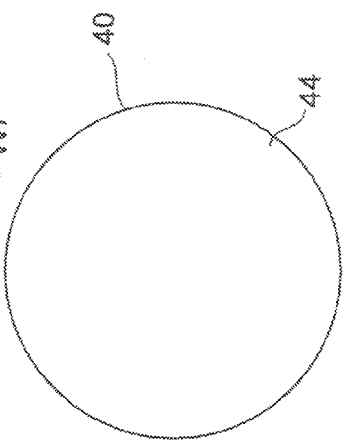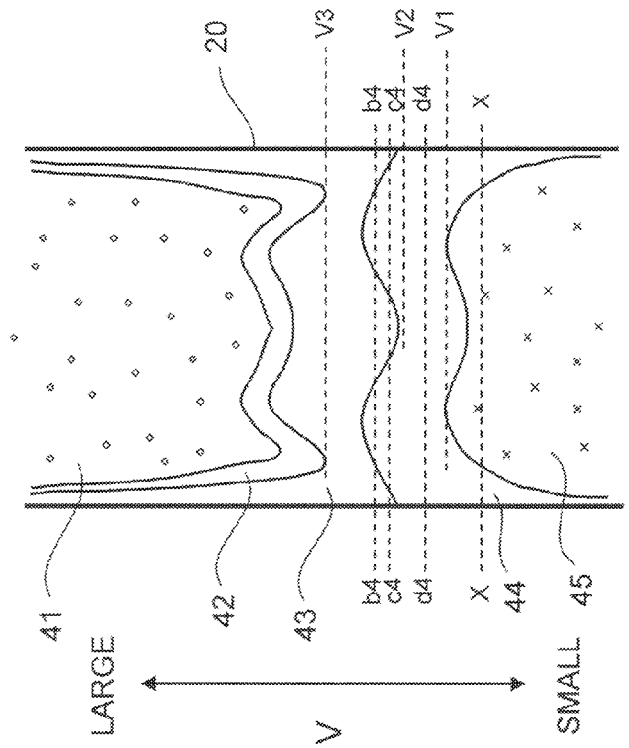

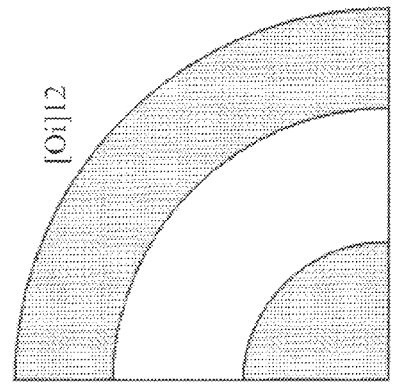
FIG.15A [Oi]12
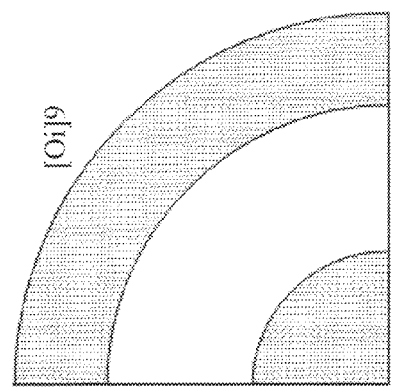
FIG.15B [Oi]9
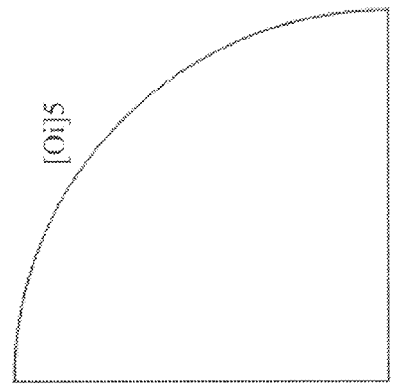
FIG.15C [Oi]5
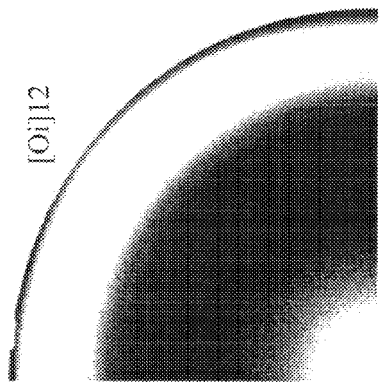
FIG.15D [Oi]12
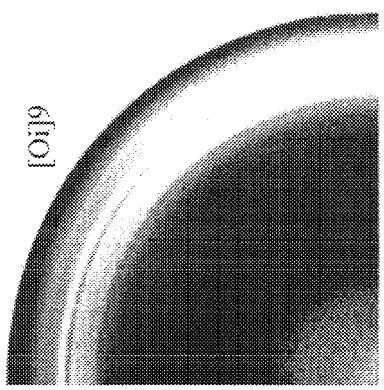
FIG.15E [Oi]9
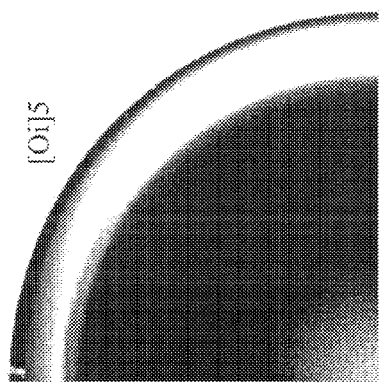
FIG.15F [Oi]5

METHOD OF MANUFACTURING SILICON SINGLE CRYSTAL, SILICON SINGLE CRYSTAL INGOT, AND SILICON WAFER

BACKGROUND OF THE INVENTION

1. Field of the Invention

The present invention relates to a method of manufacturing a silicon single crystal and a silicon single crystal ingot, and more particularly, to a method of manufacturing a silicon single crystal that is grown by a Czochralski method (CZ method) and used preferably as a substrate of a semiconductor device and a silicon single crystal ingot. Further, the present invention relates to a silicon wafer, and more particularly, to a silicon wafer that is sliced from a silicon single crystal ingot grown by a Czochralski method and preferable as a substrate of a semiconductor device.

2. Description of Related Art

When a silicon single crystal is grown by the Czochralski method, kinds and distributions of defects that are included in the silicon single crystal depend on a ratio of a pulling-up velocity V of the silicon single crystal and a temperature gradient G in a growth direction in the silicon single crystal.

FIG. 16 illustrates a general relationship between V/G and kinds and distributions of defects. A pulling-up condition of FIG. 16 is set to Gc/Ge<1, when a central portion of a pulled-up single crystal is disposed in a temperature range from a melting point to 1370° C., a temperature gradient in the central portion is defined as Gc, and a temperature gradient in an outer circumferential portion is Ge.

As illustrated in FIG. 16, when V/G is large, the amount of vacancies becomes excessively large, and a minute void (defect generally called a COP: Crystal Originated Particle) that is an aggregate of the vacancies is generated. Meanwhile, when V/G is small, the amount of interstitial silicon atoms positioned between lattices becomes excessively large, and dislocation clusters that are an aggregate of the interstitial silicon atoms are generated. Accordingly, in order to manufacture a crystal that includes neither the COPs nor the dislocation clusters, V/G needs to be controlled to be in an appropriate range in a radial direction and a length direction of the crystal. First, with respect to the radial direction of the crystal, since V is constant even at any position, a structure of a high-temperature portion (hot zone) in a CZ furnace needs to be designed, such that the temperature gradient G is in a predetermined range. Next, with respect to the length direction of the crystal, since G depends on the pulling-up length of the crystal, V needs to be changed in the length direction of the crystal to keep V/G in the predetermined range. At the present time, even in a silicon single crystal whose diameter is 300 mm, a crystal that includes neither the COPs nor the dislocation clusters are massively produced by controlling V/G.

As described above, the silicon wafer that includes neither the COPs nor the dislocation clusters are massively produced by controlling V/G and used when manufacturing an electronic device. However, this wafer includes plural regions where entire surfaces are not uniform and behaviors at the time of heat treatment are different from each other. As illustrated in FIG. 16, between a region where the COPs are generated and a region where the dislocation clusters are generated, three regions including an OSF (Oxidation Induced Stacking Fault) region, a Pv region, and a Pi region exist in the order of large V/G. The OSF region includes platelet oxygen precipitates (OSF nuclei) in an as-grown state (state where any heat treatment is not performed after a crystal is grown). The OSF region is a region where OSFs are generated when being thermally oxidized at a high temperature (in a temperature range from 1000° C. to 1200° C. in general). The Pv region includes oxygen precipitation nuclei in an as-grown state. The Pv region is a region where oxygen precipitates are easily generated when heat treatments of two steps of a low temperature and a high temperature (for example, 800° C. and 1000° C.) are performed. The Pi region rarely includes oxygen precipitates in an as-grown state. The Pi region is a region where it is difficult to generate the oxygen precipitates, even though the heat treatment is performed.

Since a difference between V/G where the COPs starts to be generated and V/G where the dislocation cluster starts to be generated is very small, a pulling-up velocity V needs to be strictly managed in order to manufacture a crystal not including the COPs and the dislocation cluster. However, even though the crystal is pulled up at a targeted pulling-up velocity V, the COPs or the dislocation clusters may be generated due to various factors. This is due to the following reasons.

The CZ furnace includes some members, such as a carbon heater, a heat insulating material, and a carbon crucible. These members are continuously used while pulling-up is performed tens of times to hundreds of times. These members are temporally deteriorated and wasted due to a reaction with vapor of a silicon melt or a solution droplet, a reaction with gas generated from carbon and the silicon melt, and a reaction with a quartz crucible, and a thermal characteristic of a hot zone in the CZ furnace is temporally varied. If the temporal variation of the hot zone is generated, a temperature gradient G is varied. Even though the crystal is pulled up at the targeted pulling-up velocity V, V/G may be deviated from a designed value. Therefore, the COPs or the dislocation clusters are generated even though the crystal is pulled up at the targeted pulling-up velocity V.

Accordingly, in order to realize the targeted V/G, a profile of the pulling-up velocity V needs to be changed according to the temporal variation of the hot zone.

In the related art, a pulling-up velocity profile is set to include an OSF region. A sample that is sliced from the pulled-up crystal is decorated with Cu (copper) or subjected to heat treatment for an OSF evaluation to evaluate the width of the OSF region, and a subsequent pulling-up velocity profile is adjusted on the basis of the width (for example, refer to Japanese Patent Application Laid-Open (JP-A) No. 2005-194186 and International Publication Pamphlet No. WO 99/40243). That is, if the OSF region is wide, the CZ furnace is varied in a direction where V/G increases (G decreases). In the subsequent pulling-up, the pulling-up velocity V is set to be low. In contrast, if the OSF region is narrow, the CZ furnace is varied in a direction where V/G decreases (G increases). In the subsequent pulling-up, the pulling-up velocity V is set to be high.

In these methods, since the width or the position of the OSF region is used as an index and the subsequent pulling-up velocity profile is adjusted, the OSF region is necessarily included even in a wafer that is shipped as a product. At the present time, the OSF region does not seem to affect an electronic device. However, since the OSF region is a region that includes OSF nuclei even in an as-grown state, that is, a platelet oxygen precipitate, the possibility of the OSF region becoming a factor causing a characteristic of a future electronic device to be deteriorated is high. Accordingly, in the future, necessity of a development of a method that stably pulls up a crystal not including the OSF region without using the width of the OSF region as an index of the pulling-up velocity adjustment is considered.

As the method that does not use the OSF region as the index of the pulling-up velocity adjustment, a method that estimates a vacancy concentration of crystal from the amount of decrease in an elastic constant softening of silicon due to an extremely low temperature and adjusts a subsequent pulling-up velocity profile has been suggested (for example, refer to Japanese Patent Application Laid-Open (JP-A) No. 2007-261935). However, in order to realize the above method, etching is performed on the wafer sliced from the silicon single crystal to remove a processing distortion, ZnO or AlN that becomes a thin film vibrator is deposited, and an external magnetic field is applied according to necessity. In this state, an ultrasonic pulse is propagated while the wafer is cooled down in a temperature range of 25K (−248° C.) or less, a sound velocity variation of the propagated ultrasonic pulse is detected, the decrease amount of an elastic constant according to the decrease in the cooling temperature is calculated from the sound velocity variation, and a vacancy concentration in the silicon wafer is evaluated from the calculated decrease amount of the elastic constant. The processes according to the above-described sequence should be executed. Therefore, an expensive evaluation facility and a complex sequence are needed, and the above method cannot be applied to a routine inspection during the manufacturing process of the silicon single crystal.

As a method that detects crystal defects in the silicon single crystal, evaluation methods based on various principles are suggested. A generally used selective wet etching method immerses a sample in a mixed solution of a material having an oxidation action with respect to silicon and a material having an oxide dissolving action, and exposes crystal defects as unevenness (etch pit in most of cases) of the etched surface. Nitric acid or chromic acid is used as the material having the oxidation action, and hydrofluoric acid is used as the material having the oxide dissolving action. Depending on the kind of used chemical material and a mixed ratio thereof, a selected ratio of normal silicon/defect is different, and sensitivity or the kind of detectable defect is different. The selective wet etching has low sensitivity as compared with the other methods, but is simple. Therefore, the selective wet etching is still used for a crystal defect evaluation at the present time. As typical etching solutions, there are a Write solution, a Secco solution, and a Dash solution that take names of people that suggest the solutions.

An infrared tomography method that is generally used from 1990's is a method that uses a difference in refractive indexes of silicon and a defect. Since infrared rays transmit the silicon, a defect in the wafer can be evaluated. This method has high sensitivity to oxygen precipitates or COPs, as compared with the selective wet etching.

In Japanese Patent Application Laid-Open (JP-A) Nos. 2000-58509 and 2007-123542, a defect detecting method using reactive ion etching (RIE) will be described. This method exposes an oxygen precipitate, such as a BMD, by heat treatment, and performs the RIE to a sample under the condition where a selected ratio of $Si/SiO_2$ is high. Thereby, the oxygen precipitate ($SiO_2$) is not etched and exposed as a protrusion. If the condition where a selected ratio of $Si/SiO_2$ is high is selected, it is reported that a defect evaluation having high sensitivity is possible as compared with the infrared tomography method.

It has been so far strongly required to provide a wafer where an oxygen precipitate is formed with a high density and a gettering capability is excellent. However, if the oxygen precipitate is one kind of crystal defect and exists on a surface layer of the wafer where a device is formed, this causes a device defect. Therefore, an annealed wafer where high-temperature heat treatment is performed on a silicon wafer having an oxygen precipitate, and the oxygen precipitate existing on the surface layer of the wafer where the device is formed is removed, or an epitaxial silicon wafer where an epitaxial film is formed on a surface of a wafer having an oxygen precipitate has been developed. However, any of new processes need to be additionally executed with respect to the wafers, productivity is decreased, and a manufacturing cost is increased.

In recent years, an insulated gate bipolar transistor (IGBT) has been developed. Like an LSI, such as a memory, the IGBT is not a device that uses only the neighboring portion of the surface of the wafer in a horizontal direction but a device that uses the wafer in a vertical direction (wafer thickness direction), and a characteristic thereof is affected by a quality of the bulk of the wafer. Therefore, the oxygen precipitate in the wafer as well as the oxygen precipitate in the wafer surface layer needs to be reduced. In recent years, a wafer that is not limited to the IGBT wafer, greatly reduces the risk of an impurity contamination due to a cleaned device, does not depend on the gettering ability as a quality required in the wafer, and a wafer that reduces, without limitation, not only the COPs and the dislocation clusters but also the oxygen precipitate as one kind of crystal defect is anticipated as a next-generation wafer to be requested.

In general, in order to decrease the oxygen precipitate in the wafer, the oxygen concentration of the crystal can be decreased. At a current situation, a low-oxygen silicon single crystal ingot where an oxygen concentration is decreased to $3 \times 10^{17}$ atoms/cm$^3$ by adjusting a crucible rotation velocity or a crystal rotation velocity using a magnetic-field-applied Czochralski method (MCZ method) for applying a magnetic field can be manufactured (oxygen concentration described in this specification is a value that is measured by Fourier transformation infrared spectrophotometry standardized in ASTM F-121 (1979)).

However, when silicon single crystal that includes a non-defect region where an oxygen precipitate is small and COPs and dislocation clusters do not exist is grown, a crystal region (Pv region) where an oxygen precipitate is active needs to be excluded as maximal as possible. However, the oxygen precipitation in the Pv region may be decreased due to the decrease in the oxygen concentration in the crystal, and the difference of the oxygen precipitate distributions in the Pv region and the Pi region may be extremely reduced. Therefore, in the defect distribution evaluation by the currently executed oxygen precipitate evaluation heat treatment (two-step heat treatment at a high temperature and a low temperature), it becomes difficult to determine a boundary between the Pv region and the Pi region.

In the oxygen precipitate evaluation heat treatment, two-step heat treatment of low-temperature heat treatment (at the temperature of 800° C. for 4 hours) and high-temperature heat treatment (at the temperature of 1000° C. for 16 hours) is performed in an oxygen atmosphere, an oxygen precipitation nucleus in the crystal is grown by the heat treatments and exposed as the oxygen precipitate, and a density distribution is evaluated by an optical microscope. However, in the evaluation method, the minute oxygen precipitation nucleus cannot be exposed, and a density or size of the exposed oxygen precipitate depends on the oxygen concentration. Additionally, due to high-temperature heat treatment for a long time, an oxygen precipitation nucleus having a small size in the crystal may be removed. Accordingly, in the defect distribution evaluation by the oxygen precipitation evaluation heat treatment, the risk of the minute oxygen precipitate existing in the crystal is high, and it is difficult to grow a silicon single crystal from which the crystal region where the minute oxygen precipitate exists is excluded.

Meanwhile, a copper decoration method that contaminates a surface of an evaluation sample with copper, is subjected to heat treatment at a temperature in a temperature range of 800° C. to 1000° C. for 3 to 20 hours to diffuse the copper into a sample, and exposes a defect of the crystal surface is effective because the crystal defect can be detected with high sensitivity. However, since the high-temperature heat treatment needs to be performed, the minute oxygen precipitation nucleus may be removed, similar to the oxygen precipitation evaluation heat treatment. Furthermore, since the plural heat treatments need to be performed for a long time, a large amount of time may be needed for the evaluation, and a time lag until the evaluation result is fed back to the single crystal growing condition may increase.

Meanwhile, according to the RIE method that is described in JP-A No. 2000-58509, the minute oxygen precipitate can be detected. In JP-A No. 2000-58509, it is only reported that the oxygen precipitate such as the BMD exposed by the heat treatment can be evaluated, and an evaluation with respect to a silicon wafer in an as-grown state is not described. At the technology level of when JP-A No. 2000-58509 is filed, only OSF nuclei become a problem as a defect included in the silicon wafer in an as-grown state. Since the OSF nuclei are easily exposed by the thermal oxidation, the OSF nuclei do not need to be detected in the as-grown state. Further, at the technology level of when JP-A No. 2000-58509 is filed, it cannot be determined whether or not the Pv region includes an oxygen precipitation nucleus in the as-grown state.

JP-A No. 2007-123542 describes that the OSF nuclei can be exposed by the RIE method. However, like the oxygen precipitate that is included in the Pv region, whether or not the RIE method is effective with respect to the oxygen precipitate more minute than the OSF nuclei are not described. This is because the oxygen precipitate included in the Pv region is generally needed as a getter site, and does not need to be removed.

SUMMARY OF THE INVENTION

Accordingly, the invention has been made in consideration of the above-described problems, and it is an object of the invention to provide a method of manufacturing a silicon single crystal that does not include a COP region, a dislocation cluster region, preferably and an OSF region by specifying a region included in a pulled-up crystal by means of a simple method not using the position or width of an OSF region as an index but adjusting a subsequent pulling-up velocity profile. It is another object of the invention to provide a silicon wafer that is sliced from the silicon single crystal manufactured by the above method.

The inventors considered that a problem is caused by even a minute oxygen precipitate included in a Pv region in terms of a characteristic when considering a vertical silicon device such as an IGBT, and the oxygen precipitate needs to be efficiently evaluated and consequently excluded. Accordingly, it is an another object of the invention to provide a method of growing a silicon single crystal that has an extremely small oxygen precipitate by performing an evaluation in an as-grown state without performing a process, such as heat treatment, requiring a long time. It is a still another object of the invention to provide a silicon single crystal ingot.

The inventors have earnestly studied which defect can be exposed, when reactive ion etching is performed on a silicon wafer in an as-grown state. As a result, it is revealed that if the reactive ion etching is performed on the silicon wafer in the as-grown state, OSF nuclei included in an OSF region and an oxygen precipitation nucleus included in a Pv region are exposed. This means that a boundary between the Pv region and the Pi region can be determined. Accordingly, it is determined that a change in profile of a pulling-up velocity V according to a temporal variation of a hot zone can be changed using a position or a width of the Pv region instead of using a position or a width of the OSF region as an index.

According to an aspect of the invention, there is provided a method of manufacturing a silicon single crystal. The method includes growing a silicon single crystal ingot not including a COP and a dislocation cluster by a Czochralski method; slicing a silicon wafer from the silicon single crystal ingot; and performing reactive ion etching on the silicon wafer in an as-grown state to expose a grown-in defect including silicon oxide as a protrusion on an etching surface. A growing condition of subsequent growing is adjusted on the basis of a generation region of the exposed protrusion.

According to this aspect, without performing processes requiring a long time, such as heat treatment to expose a defect or a measurement of the decrease amount of an elastic constant of silicon associated with an extremely low temperature, a crystal state corresponding to current V/G can be quickly grasped. Therefore, if a subsequent growing condition is adjusted (fed back) on the basis of obtained information, a profile of a pulling-up velocity V can be quickly changed. Further, in addition to the feedback adjustment of the subsequent growing condition, acceptance or rejection of the silicon single crystal ingot can be determined.

Preferably, in the growing of the silicon single crystal ingot, a silicon single crystal ingot that does not include OSF nuclei are grown. In the invention, since V/G is detected without using the OSF region as an index, the invention is suitable for manufacturing a silicon single crystal ingot that does not include the OSF nuclei.

Preferably, in the process of the reactive ion etching, the silicon wafer is etched using an aqueous solution containing hydrofluoric acid and nitric acid, and the reactive ion etching is performed on an etched surface. Accordingly, since a process on the silicon wafer is very simple, the pulling-up velocity V can be quickly fed back.

In the process of the reactive ion etching, the silicon wafer may be cleaved, and the reactive ion etching may be performed on a cleavage surface. This is because the cleavage surface of the silicon wafer can obtain the same characteristic as that in an etching surface obtained by etching using an aqueous solution containing hydrofluoric acid and nitric acid.

Additionally, in the process of the reactive ion etching, mirror polishing may be performed on the silicon wafer, and the reactive ion etching may be performed on a mirror polished surface. If the mirror polishing is performed on the silicon wafer, a defect that is generated due to a disturbance can be almost completely removed. Accordingly, a generation region of a protrusion can be accurately evaluated.

According to another aspect of the invention, there is provided a silicon wafer that is sliced from a silicon single crystal ingot grown by a Czochralski method and does not include any of a COP, OSF nuclei, and dislocation clusters. When reactive ion etching is performed in an as-grown state to expose a grown-in defect including silicon oxide as a protrusion on an etching surface, a generation region of the exposed protrusion becomes a disk shape and/or a ring shape. This silicon wafer can be obtained by a method of manufacturing a silicon single crystal in the invention.

The inventors have discovered that, when a reactive ion etching is performed on a silicon wafer in an as-grown state, a minute oxygen precipitate not detected in oxygen precipitate evaluation heat treatment can be detected, in addition to a COP or OSF nuclei. Accordingly, it is considered that, if the minute oxygen precipitate is evaluated using the reactive ion etching, a silicon single crystal not including the minute oxygen precipitate can be grown.

According to still another aspect of the invention, there is provided a method of manufacturing a silicon single crystal. When an evaluation sample is sliced from a silicon single crystal ingot, which is grown by a Czochralski method and does not include a COP and a dislocation cluster, and reactive ion etching is performed on the evaluation sample in an as-grown state, the silicon single crystal ingot is pulled up under a condition where a protrusion generated due to a defect including silicon oxide is not formed on a surface of the evaluation sample.

According to this aspect of the invention, since pulling-up is performed under the condition where the protrusion is not formed in the evaluation using the reactive ion etching, a silicon single crystal that does not include a minute oxygen precipitate can be grown. Therefore, like an IGBT, a high-quality silicon single crystal that is affected by a quality of a bulk of the wafer can be provided. That is, in a silicon single crystal ingot that does not include a COP and a dislocation cluster, when the reactive ion etching is performed on the wafer in the as-grown state that is obtained by slicing the silicon single crystal ingot in a radial direction, a silicon single crystal ingot that is composed of a crystal region where a protrusion generated due to a defect including silicon oxide is not formed can be provided.

The method according to still another aspect of the invention comprises: growing the silicon single crystal ingot; slicing the evaluation sample from the silicon single crystal ingot; performing the reactive ion etching on the evaluation sample in the as-grown state to expose the defect including silicon oxide as the protrusion; and adjusting a growing condition of subsequent growing, on the basis of a generation region of the exposed protrusion. Therefore, it is preferable that the silicon single crystal ingot is pulled up under the condition where the protrusion is not formed on the surface of the evaluation sample. Accordingly, since the growing condition in the subsequent growing is adjusted according to the temporal variation of the hot zone, a silicon single crystal that does not include a minute oxygen precipitate can be massively produced.

Preferably, in the growing of the silicon single crystal ingot, when a temperature gradient in a central portion is defined as Gc and a temperature gradient in an outer circumferential portion is defined as Ge, the silicon single crystal ingot is grown under a condition of Gc/Ge≧1. Accordingly, the crystal region that does not include the minute oxygen precipitate can be extended over the entire region in a radial direction, and a yield of the silicon single crystal that does not include the minute oxygen precipitate can be improved.

Preferably, in the process of the reactive ion etching, OSFs do not exist in a region where the protrusion is not generated. Accordingly, a high-quality silicon single crystal can be provided.

Preferably, an oxygen concentration in the silicon single crystal is $9 \times 10^{17}$ atoms/cm$^3$ or less. Accordingly, generation of the oxygen precipitate can be effectively suppressed.

Preferably, the evaluation sample is obtained by slicing the silicon single crystal ingot in a radial direction or in an axial direction. When the evaluation sample that is obtained by slicing the silicon single crystal ingot in the axial direction is used, plural samples are sliced at a predetermined interval in a crystal pulling-up axial direction, thereby confirming a variation in a defect distribution of the crystal pulling-up axial direction. Meanwhile, when the evaluation sample that is obtained by slicing the silicon single crystal ingot in the axial direction is used, the defect distribution of the crystal pulling-up axial direction can be confirmed by producing the plural samples continuous in the axial direction.

According to the invention, without performing processes requiring a long time, such as heat treatment to expose a defect or a measurement of the decrease amount of an elastic constant of silicon due to an extremely low temperature, a crystal state according to current V/G can be quickly grasped. As a result, since the feedback with respect to a nearest batch can be performed, crystal that does not include a COP and a dislocation cluster can be strictly and massively produced. Since the OSF region is not used as an index, crystal that does not include the COP, the dislocation cluster, and the OSF region can be obtained.

According to the invention, without performing processes requiring a long time, such as heat treatment to expose a defect or a measurement of the decrease amount of an elastic constant of silicon due to an extremely low temperature, a high-quality silicon single crystal that does not include a minute oxygen precipitate can be grown.

In the invention, the silicon single crystal ingot is a silicon single crystal ingot that does not include the COP, the dislocation cluster, and the minute oxygen precipitate. By slicing the wafer from the silicon single crystal ingot, a high-quality silicon wafer that does not include various defects over an entire region of a surface layer and a bulk can be provided.

BRIEF DESCRIPTION OF THE DRAWINGS

The above features and advantages of the present invention will be more apparent from the following description of certain preferred embodiments taken in conjunction with the accompanying drawings, in which:

FIG. 3A is a diagram illustrating another example of a relationship between a pulling-up velocity V of a silicon single crystal ingot 20 and kinds and distributions of defects;

FIGS. 3B to 3D are cross-sectional views taken along the lines b2-b2, c2-c2, and d2-d2 of FIG. 3A, respectively;

FIG. 6A is a diagram illustrating another example of a relationship between a pulling-up velocity V of a silicon single crystal ingot and kinds and distributions of defects;

FIGS. 6B to 6D are cross-sectional views taken along the lines b4-b4, c4-c4, and d4-d4 of FIG. 6A, respectively;

FIG. 15 is a diagram illustrating an evaluation result in an example 4; and

DETAILED DESCRIPTION OF THE EMBODIMENTS

Hereinafter, the preferred embodiments of the invention will be described in detail with reference to the accompanying drawings.

Figure 1:
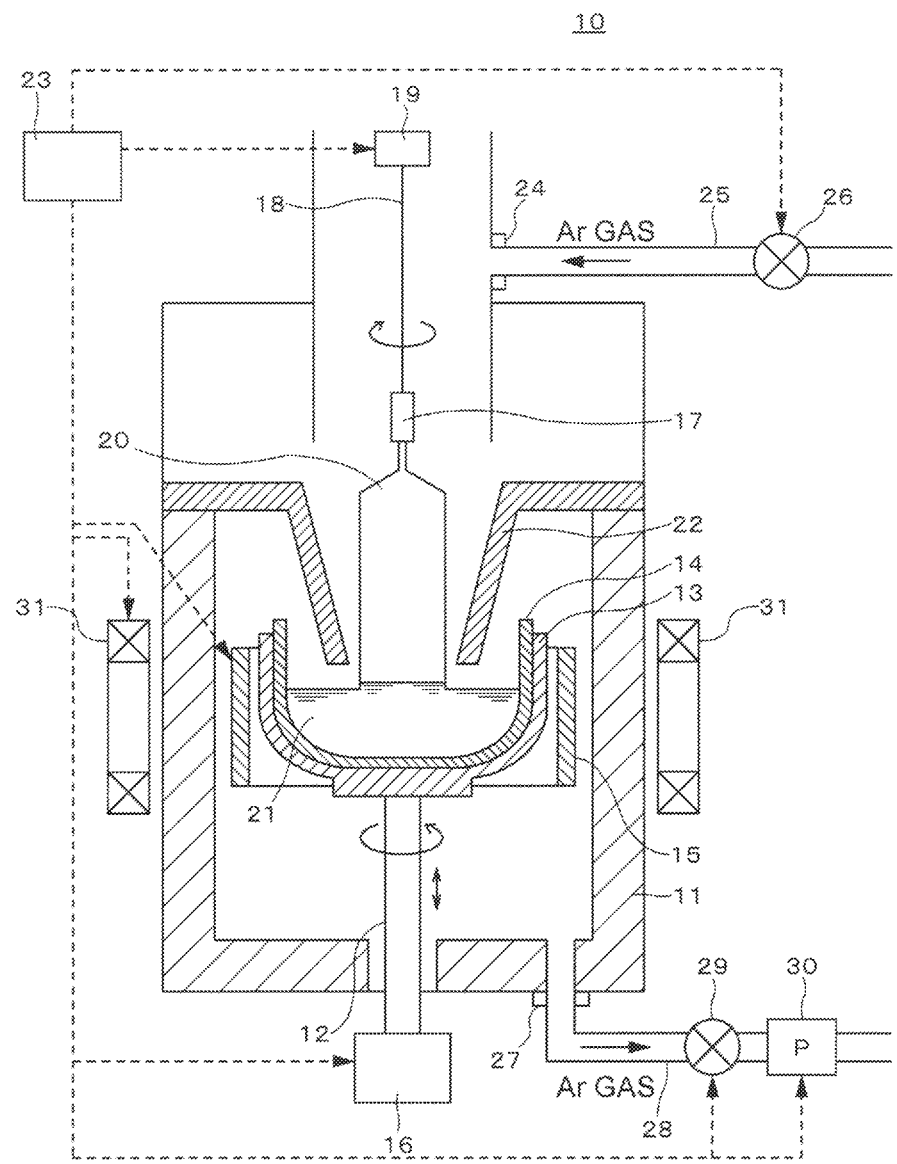
FIG. 1 is a schematic diagram illustrating the configuration of a pulling-up apparatus that can be applied in a method of manufacturing a silicon single crystal according to a preferred embodiment of the invention.

FIG. 1 illustrates the schematic configuration of a pulling-up apparatus that can be used in a method of manufacturing a silicon single crystal according to an embodiment of the present invention.

A silicon single crystal pulling-up apparatus 10 illustrated in FIG. 1 includes a chamber 11, a support rotation shaft 12 that penetrates the center of a bottom portion of the chamber 11 and is provided in a vertical direction, a graphite susceptor 13 that is fixed on an upper end of the support rotation shaft 12, a quartz crucible 14 that is accommodated in the graphite susceptor 13, a heater 15 that is provided around the graphite susceptor 13, a support shaft driving mechanism 16 that lifts and rotates the support rotation shaft 12, a seed chuck 17 that holds a seed crystal, a pulling-up wire 18 that suspends the seed chuck 17, a wire winding mechanism 19 that winds the pulling-up wire 18, a heat shielding member 22 that prevents a silicon single crystal ingot 20 from being heated due to radiation heat from the heater 15 and the quartz crucible 14 and suppresses a variation in temperature of a silicon melt 21, and a control device 23 that controls the various components.

On the chamber 11, a gas introducing port 24 that introduces Ar gas into the chamber 11 is provided. The Ar gas is introduced from the gas introducing port 24 through a gas tube 25 to the chamber 11, and the amount of gas introduced is controlled by a conductance valve 26.

On a bottom portion of the chamber 11, a gas discharge port 27 that discharges the Ar gas in the chamber 11 is provided. The Ar gas in the closed chamber 11 is discharged from the gas discharge port 27 through a discharge gas tube 28 to the outside of the apparatus. In the middle of the discharge gas tube 28, a conductance value 29 and a vacuum pump 30 are disposed. A flow rate of the Ar gas is controlled by the conductance valve 29 while the Ar gas in the chamber 11 is sucked by the vacuum pump 30, such that a decompression state in the chamber 11 is maintained.

At the outside of the chamber 11, a magnetic field applying device 31 that applies a magnetic field to the silicon melt 21 is provided. The magnetic field that is applied from the magnetic field applying device 31 may be a horizontal magnetic field or a cusp magnetic field.

Figure 2A:
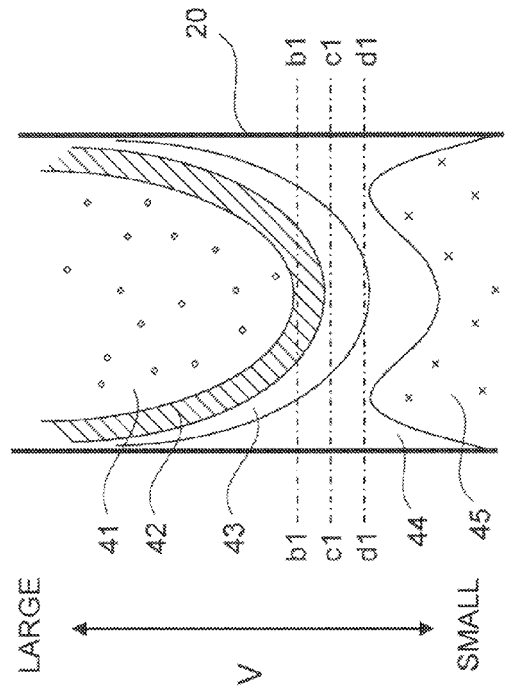
FIG. 2A is a diagram illustrating one example of a relationship between a pulling-up velocity V of a silicon single crystal ingot 20 and kinds and distributions of defects.
Figure 2B:
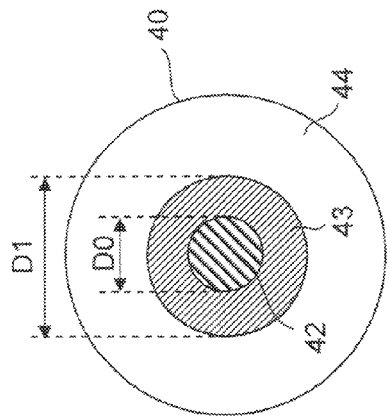
FIGS. 2B to 2D are cross-sectional views taken along the lines b1-b1, c1-c1, and d1-d1 of FIG. 2A, respectively.
Figure 2C:
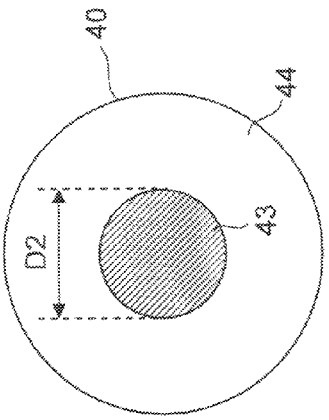
Figure 2D:
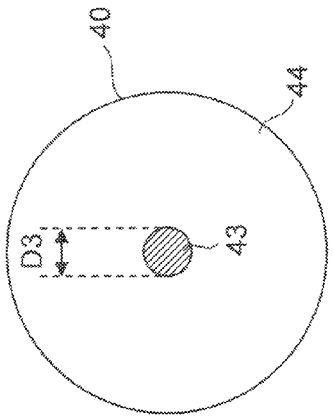

FIG. 2A illustrates one example of a relationship between a pulling-up velocity V of the silicon single crystal ingot 20 and kinds and distributions of defects. FIGS. 2B to 2D are cross-sectional views taken along the lines b1-b1, c1-c1, and d1-d1 of FIG. 2A, respectively. The pulling-up condition of FIG. 2A is a pulling-up condition where an OSF region 42 appears in a disk shape. In this case, V/G of an approximately central portion of the crystal is larger (that is, G is small) than that of an outer circumferential portion thereof.

Under the pulling-up condition of FIG. 2A, if the pulling-up velocity V is set to a velocity corresponding to the line b1-b1, as illustrated in FIG. 2B, the OSF region 42 and a Pv region 43 appear in a disk shape in the sliced silicon wafer 40. More specifically, the OSF region 42 appears at the center of the silicon wafer 40, the Pv region 43 appears at the outside of the OSF region 42, and an outside portion of the Pv region 43 entirely becomes a Pi region 44. The OSF region 42 has a diameter D0 and the Pv region 43 has a diameter D1. In this way, when the pulling-up velocity V is set to the velocity corresponding to the line b1-b1, the silicon single crystal ingot 20 that does not include the COPs 41 and the dislocation clusters 45 is obtained, but the OSF region 42 having a disk shape is formed on a portion corresponding to a center axis. Accordingly, in order to obtain a crystal that does not include the COPs 41, the dislocation clusters 45, and the OSF region 42, the pulling-up velocity V needs to be decreased by the control device 23. When the crystal that does not include the OSF region 42 is used as a non-defective product, the silicon single crystal ingot 20 is rejected.

Under the pulling-up condition of FIG. 2A, if the pulling-up velocity V is set to the velocity corresponding to the line c1 to c1, as illustrated in FIG. 2C, the Pv region 43 that has the diameter D2 appears at the center of the sliced silicon wafer 40, and the outside of the Pv region 43 entirely becomes the Pi region 44. In this case, the diameter D2 of the Pv region 43 is smaller than the diameter D1 of the Pv region 43 illustrated in FIG. 2B (D2<D1). In this way, when the pulling-up velocity V is set to the velocity corresponding to the line c1-c1, the silicon single crystal ingot 20 that does not include any of the COPs 41, the OSF region 42, and the dislocation clusters 45 can be obtained. Since the sufficient margin is secured with respect to the pulling-up velocity V where the dislocation clusters 45 are generated, the pulling-up velocity V does not need to be changed by the control device 23. Further, when the crystal that does not include the OSF region 42 is used as a non-defective product, the silicon single crystal ingot 20 is accepted.

Under the pulling-up condition of FIG. 2A, if the pulling-up velocity V is set to the velocity corresponding to the line d1 to d1, as illustrated in FIG. 2D, the Pv region 43 that has the diameter D3 appears at the center of the silicon wafer 40, and the outside of the Pv region 43 entirely becomes the Pi region 44. In this case, the diameter D3 of the Pv region 43 is smaller than the diameter D2 of the Pv region 43 illustrated in FIG. 2C (D3<D2). In this way, when the pulling-up velocity V is set to the velocity corresponding to the line d1-d1, the silicon single crystal ingot 20 that does not include any of the COPs 41, the OSF region 42, and the dislocation clusters 45 can be obtained. In this case, since only a small margin remains with respect to the pulling-up velocity V where the dislocation clusters 45 are generated, the pulling-up velocity V needs to be increased by the control device 23. However, when the crystal that does not include the OSF region 42 is used as a non-defective product, the silicon single crystal ingot 20 is accepted.

Under the pulling-up condition of FIG. 2A, a control direction of the pulling-up velocity V can be determined on the basis of the diameter of the Pv region 43 having a disk shape. Furthermore, acceptance or rejection of the silicon single crystal ingot 20 can also be determined.

FIG. 3A illustrates another example of a relationship between a pulling-up velocity V of a silicon single crystal ingot 20 and kinds and distributions of defects, under a condition where radial direction distributions of a temperature gradient G are different from those in FIG. 2. FIGS. 3B to 3D are cross-sectional views taken along the lines b2-b2, c2-c2, and d2-d2 of FIG. 3A, respectively. The pulling-up condition of FIG. 3A is a pulling-up condition where the OSF region 42 appears in a disk shape and a ring shape. In this case, V/G of an approximately central portion and an outer circumferential portion of the crystal is large (that is, G is small).

Under the pulling-up condition of FIG. 3A, if the pulling-up velocity V is set to a velocity corresponding to the line b2-b2, as illustrated in FIG. 3B, the OSF region 42 and the Pv region 43 appear in a disk shape and a ring shape, in the sliced silicon wafer 40. More specifically, the OSF region 42 appears at the center of the silicon wafer 40, and the Pv region 43, the Pi region 44, the Pv region 43, the OSF region 42, the Pv region 43, and the Pi region 44, each of which has a concentric shape, appear at the outside of the OSF region 42 in this order. In this case, the Pv region 43 that has a disk shape has a diameter D4. A width of a ring that includes the OSF region 42 and the Pv region 43 is W1. In this way, when the pulling-up velocity V is set to the velocity corresponding to the line b2-b2, the silicon single crystal ingot 20 that does not include the COPs 41 and the dislocation clusters 45 are obtained, but the OSF region 42 having a disk shape and the OSF region 42 having a ring shape are formed. Accordingly, in order to obtain a crystal that does not include the COPs 41, the dislocation clusters 45, and the OSF region 42, the pulling-up velocity V needs to be decreased by the control device 23. When the crystal that does not include the OSF region 42 is used as a non-defective product, the silicon single crystal ingot 20 is rejected.

Under the pulling-up condition of FIG. 3A, if the pulling-up velocity V is set to the velocity corresponding to the line c2 to c2, as illustrated in FIG. 3C, the Pv regions 43 appear in a disk shape and a ring shape, in the sliced silicon wafer 40. In this case, the diameter of the Pv region 43 having a disk shape is D5, and is smaller than the diameter D4 of the Pv region 43 having a disk shape illustrated in FIG. 3B (D5<D4). Further, the width of the Pv region 43 having a ring shape is W2, and is smaller than the width W1 of the Pv region 43 having a ring shape illustrated in FIG. 3B (W2<W1). In this way, when the pulling-up velocity V is set to the velocity corresponding to the line c2-c2, the silicon single crystal ingot 20 that does not include any of the COPs 41, the OSF region 42, and the dislocation clusters 45 can be obtained. Since the sufficient margin is secured with respect to the pulling-up velocity V where the dislocation clusters 45 are generated, the pulling-up velocity V does not need to be changed by the control device 23. Further, when the crystal that does not include the OSF region 42 is used as a non-defective product, the silicon single crystal ingot 20 is accepted.

Under the pulling-up condition of FIG. 3A, if the pulling-up velocity V is set to the velocity corresponding to the line d2 to d2, as illustrated in FIG. 3D, the Pv region 43 appears in a disc shape in the sliced silicon wafer 40, and the Pv region 43 having a ring shape is disappeared. In this case, the diameter D6 of the Pv region 43 having a disk shape is smaller than the diameter D5 of the Pv region 43 illustrated in FIG. 3C (D6<D5). In this way, when the pulling-up velocity V is set to the velocity corresponding to the line d2-d2, the silicon single crystal ingot 20 that does not include any of the COPs 41, the OSF region 42, and the dislocation clusters 45 can be obtained. Since only a small margin remains with respect to the pulling-up velocity V where the dislocation clusters 45 are generated, the pulling-up velocity V needs to be increased by the control device 23. However, when the crystal that does not include the OSF region 42 is used as a non-defective product, the silicon single crystal ingot 20 is accepted.

Under the pulling-up condition of FIG. 3A, a control direction of the pulling-up velocity V can be determined on the basis of the diameter of the Pv region 43 having a disk shape or the width (or existence or non-existence) of the Pv region having a ring shape. Further, acceptance or rejection of the silicon single crystal ingot 20 can be determined.

Figure 4B:
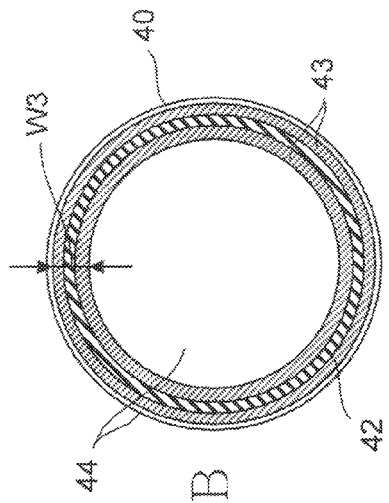
FIGS. 4B to 4D are cross-sectional views taken along the lines b3-b3, c3-c3, and d3-d3 of FIG. 4A, respectively.
Figure 4C:
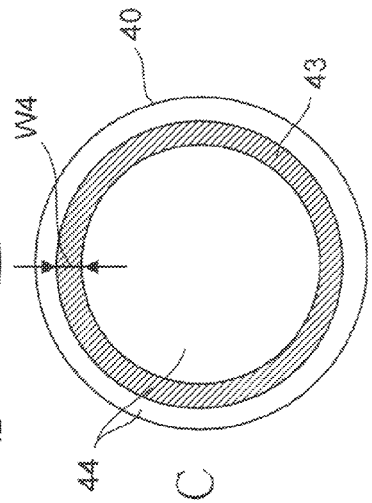
Figure 4D:
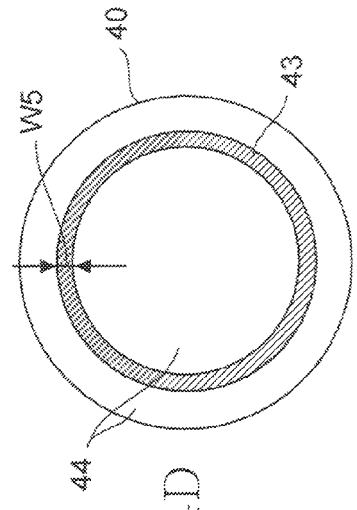
Figure 4A:
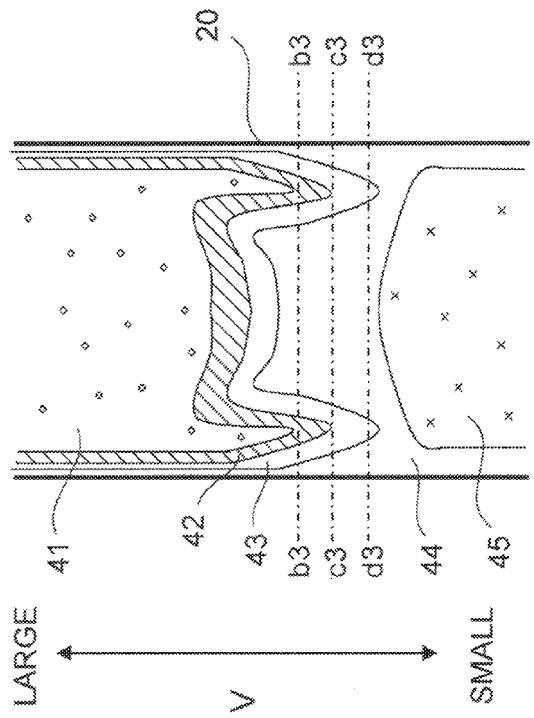
FIG. 4A is a diagram illustrating still another example of a relationship between a pulling-up velocity V of a silicon single crystal ingot 20 and kinds and distributions of defects.

FIG. 4A illustrates an another example of a relationship between a pulling-up velocity V of a silicon single crystal ingot 20 and kinds and distributions of defects, under a condition where radial direction distributions of a temperature gradient G are different from those in FIGS. 2A and 3A. FIGS. 4B to 4D are cross-sectional views taken along the lines b3-b3, c3-c3, and d3-d3 of FIG. 4A, respectively. The pulling-up condition of FIG. 4A is a pulling-up condition where the OSF region 42 appears in a ring shape. In this case, V/G of an outer circumferential portion of the crystal is large (that is, G is small).

Under the pulling-up condition of FIG. 4A, if the pulling-up velocity V is set to a velocity corresponding to the line b3-b3, as illustrated in FIG. 4B, the OSF region 42 and the Pv region 43 appear in a ring shape, in the sliced silicon wafer 40. More specifically, the OSF region 42 that has a ring shape appears between the two PV regions 43 having a ring shape, and the other region becomes the Pi region 44. A width of a ring that includes the OSF region 42 and the Pv region 43 is W3. In this way, when the pulling-up velocity V is set to the velocity corresponding to the line b3-b3, the silicon single crystal ingot 20 that does not include the COPs 41 and the dislocation clusters 45 are obtained, but the OSF region 42 having a ring shape is formed. Accordingly, in order to obtain a crystal that does not include the COPs 41, the dislocation clusters 45, and the OSF region 42, the pulling-up velocity V needs to be decreased by the control device 23. When the crystal that does not include the OSF region 42 is used as a non-defective product, the silicon single crystal ingot 20 is rejected.

Under the pulling-up condition of FIG. 4A, if the pulling-up velocity V is set to the velocity corresponding to the line c3 to c3, as illustrated in FIG. 4C, the Pv region 43 appears in a ring shape, in the sliced silicon wafer 40. In this case, the width of the Pv region 43 having a ring shape is W4, and is smaller than the width W3 of the Pv region having a ring shape illustrated in FIG. 4B (W4<W3). In this way, when the pulling-up velocity V is set to the velocity corresponding to the line c3-c3, the silicon single crystal ingot 20 that does not include any of the COPs 41, the OSF region 42, and the dislocation clusters 45 can be obtained. Since the sufficient margin is secured with respect to the pulling-up velocity V where the dislocation clusters 45 are generated, the pulling-up velocity V does not need to be changed by the control device 23. Further, when the crystal that does not include the OSF region 42 is used as a non-defective product, the silicon single crystal ingot 20 is accepted.

Under the pulling-up condition of FIG. 4A, if the pulling-up velocity V is set to the velocity corresponding to the line d3 to d3, as illustrated in FIG. 4D, the Pv region 43 appears in a ring shape, in the sliced silicon wafer 40. However, the width W5 of the Pv region 43 having a ring shape is smaller than the width W4 of the Pv region 43 illustrated in FIG. 4C (W5<W4). In this way, when the pulling-up velocity V is set to the velocity corresponding to the line d3-d3, the silicon single crystal ingot 20 that does not include any of the COPs 41, the OSF region 42, and the dislocation clusters 45 can be obtained. Since only a small margin remains with respect to the pulling-up velocity V where the dislocation clusters 45 are generated, the pulling-up velocity V needs to be increased by the control device 23. However, when the crystal that does not include the OSF region 42 is used as a non-defective product, the silicon single crystal ingot 20 is accepted.

In this way, under the pulling-up conditions of FIG. 4A, a control direction of the pulling-up velocity V can be determined on the basis of the width (or existence or non-existence) of the Pv region 43 appearing in a ring shape. Furthermore, acceptance or rejection of the silicon single crystal ingot 20 can also be determined.

As described above, even under any one of the pulling-up condition (refer to FIGS. 2A to 2D) where the OSF region 42 appears in a disk shape, the pulling-up condition (refer to FIGS. 3A to 3D) where the OSF regions 42 appear in a disk shape and a ring shape, and the pulling-up condition (refer to FIGS. 4A to 4D) where the OSF region 42 appears in a ring shape, if the position and the width of the Pv region 43 (specifically, the diameter in the case where the Pv region has a disk shape and the width in the case where the Pv region has a ring shape) is observed, it can be determined whether the current pulling-up velocity V is faster or later than the optimal pulling-up velocity V. In this case, the optimal pulling-up velocity V means a pulling-up velocity at which the silicon single crystal ingot 20 that does not include any of the COPs 41, the OSF region 42, and the dislocation clusters 45 can be obtained, and the margin can be sufficiently secured.

Next, a method of observing the position and the width of the Pv region will be described.

The position and the width of the Pv region can be observed by exposing a grown-in defect including silicon oxide as a protrusion on an etching surface by means of a RIE method. Specifically, a silicon single crystal ingot that does not include the COPs and the dislocation clusters are grown using a Czochralski method (growing process), a silicon wafer is sliced from the silicon single crystal ingot (slicing process), and reactive ion etching is performed on the silicon wafer in an as-grown state to expose the grown-in detect including the silicon oxide as the protrusion on the etching surface (etching process). In this way, the position and the width of the Pv region can be observed. As described above, the observed position and width of the Pv region become an index used to determine whether the current pulling-up velocity V is faster or later than the optimal pulling-up velocity V. Based on this, if the observed position and width are fed back to a growing condition in a subsequent growing process, a silicon single crystal ingot that has a desired quality can be stably and massively produced. The silicon single crystal ingot that has the desired quality is a silicon single crystal ingot that does not include OSF nuclei. The growing condition in the subsequent growing process is adjusted by adjusting the pulling-up velocity V. With respect to the variation in the temperature gradient G of the single crystal axis direction according to the single crystal growth, an interval between the silicon melt 21 and the heat shielding member 22 may be adjusted to adjust the magnitude of the temperature gradient G itself or adjust both the pulling-up velocity V and the temperature gradient G.

In order to expose the silicon oxide as the protrusion by the RIE, the RIE needs to be performed, under the condition where Si is etched more easily than $SiO_2$, that is, a selected ratio of $Si/SiO_2$ is high. Thereby, an oxygen precipitate ($SiO_2$) is exposed as the protrusion without being almost etched.

Typically, an evaluation of the Pv region is performed by oxygen precipitate evaluation heat treatment that includes two-step heat treatment of low temperature heat treatment (at a temperature of 800° C. for 4 hours) and high temperature heat treatment (at a temperature of 1000° C. for 16 hours) in an oxygen atmosphere. However, when a concentration of oxygen that is included in crystal is low, particularly, when a low oxygen silicon single crystal ingot where an oxygen concentration is $9 \times 10^{17}$ atoms/cm$^3$ or less is grown, oxygen precipitation is suppressed. Therefore, detection of the OSF region or the Pv region becomes difficult, and an accurate defect distribution determination becomes difficult.

In the oxygen precipitate evaluation heat treatment, if the oxygen precipitate is not grown up to a predetermined size or more, the oxygen precipitate cannot be detected. As a result, it is difficult to detect oxygen precipitation nuclei that has a small size. Further, since the possibility of the oxygen precipitation nuclei having the small size existing in the crystal being disappeared due to the high temperature heat treatment for a long time exists, a grown-in detect in an as-grown state cannot be strictly evaluated.

Meanwhile, in the RIE method, since the high temperature heat treatment is not performed, the oxygen precipitation nuclei are not removed, and the grown-in defect in the as-grown state can be evaluated as it is. When the concentration of oxygen that is included in the crystal is low, particularly, even in the case of a low oxygen crystal where an oxygen concentration is $9 \times 10^{17}$ atoms/cm$^3$ or less, a minute oxygen precipitate can be exposed as a protrusion. As a result, the minute oxygen precipitate can be surely detected.

Although not limited in particular, during the evaluation process, under the condition, it is preferred that an atmosphere of the RIE is set as $HBr/Cl_2/He+O_2$ mixed gas and a selected ratio of $Si/SiO_2$ is set to 100 or more, approximately 5 μm etching is preferably performed. After the RIE, a cleaning process is preferably executed using a hydrofluoric-acid aqueous solution to remove a reactive product attached at the time of the RIE. At the time of observing the protrusion, it is preferable that a surface etched by the RIE be visually observed and observed by an optical microscope, under a convergent light.

During the evaluation process, when the region where the protrusion is formed is determined, only the region that is concentrically distributed in a disc shape or a ring shape is evaluated. This is because the crystal defect (or the oxygen precipitate) is concentrically distributed in a disk shape or a ring shape with respect to the center of the crystal, and thereby the protrusion that is not concentrically distributed can be determined as a defect due to a disturbance. Accordingly, in the invention, the "crystal region where there is no protrusion" may include the protrusion that is not concentrically distributed in a disc shape or a ring shape in the concentric circle shape.

In this case, a relationship between a region where the OSFs are generated and a region where a protrusion is detected by the RIE method will be described.

Figure 5A:
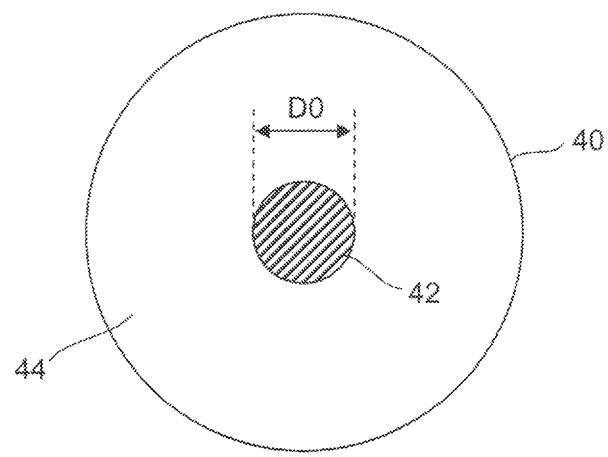
FIG. 5A is a diagram illustrating a relationship between a region where OSFs are generated and a region where a protrusion is detected by a RIE method, which specifically illustrates a silicon wafer where the OSFs are exposed by heat treatment.
Figure 5B:
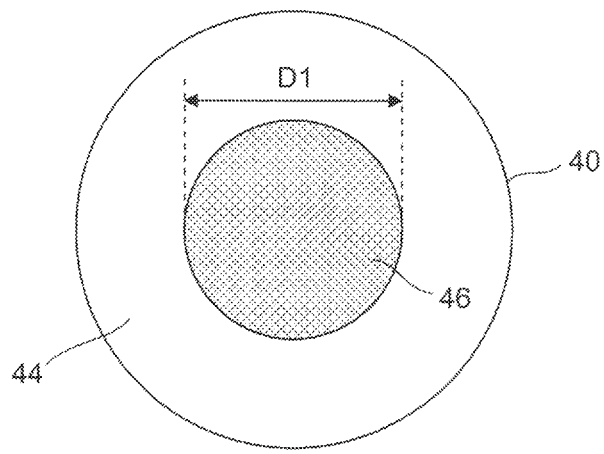
FIG. 5B is a diagram illustrating a relationship between a region where OSFs are generated and a region where a protrusion is detected by a RIE method, which specifically illustrates a silicon wafer where the protrusion is exposed by the RIE method.

FIGS. 5A and 5B illustrate a relationship between a region where the OSFs are generated and a region where a protrusion is detected by a RIE method. Specifically, FIG. 5A illustrates a silicon wafer where the OSFs are exposed by heat treatment. FIG. 5B illustrates a silicon wafer where the protrusion is exposed by the RIE method.

As described above, the OSF region is the region that includes a platelet oxygen precipitate in an as-grown state. However, the platelet oxygen precipitate is not exposed if the platelet oxygen precipitate is not thermally oxidized at a high temperature of about 1000° C. to 1200° C. In the OSF region 42 illustrated in FIG. 5A, a position and a width of the OSF region that is exposed by the heat treatment are displayed. In this example, the OSF region 42 that has the diameter D0 appears at the center of the silicon wafer 40. Meanwhile, if the RIE is performed on the silicon wafer in an as-grown state under a condition where a selected ratio of Si/SiO2 is high, without performing the heat treatment, as illustrated in FIG. 5B, a protrusion generation region 46 having a diameter D1 appears at the center of the silicon wafer 40. In this case, the diameter D1 of the protrusion generation region 46 is larger than the diameter D0 of the OSF region 42 (D1>D0).

The protrusion generation region 46 is a combined region of the OSF region 42 and the Pv region 43 illustrated in FIG. 2B. That is, if the RIE is performed on the silicon wafer in the as-grown state, the protrusion is generated by the OSF region 42 and the Pv region 43, and the protrusion is hardly generated in the Pi region 44. This means that a boundary between the Pv region 43 and the Pi region 44 can be determined, if the RIE is performed. Accordingly, if a growing condition during a subsequent growing process is adjusted on the basis of the position and the width of the protrusion generation region 46, a silicon single crystal ingot that does not include OSF nuclei can be stably and massively produced.

The sliced silicon wafer may be etched using an aqueous solution containing hydrofluoric acid and nitric acid and the RIE (etching process) may be performed on the etched surface (case 1). The sliced silicon wafer may be cleaved and the RIE may be performed on a cleavage surface (case 2). The sliced silicon wafer may be subjected to mirror polishing and the RIE may be performed on the mirror polished surface (case 3). This means that the exposing of the protrusion by the RIE is almost identical with respect to all surfaces of the silicon wafer.

As described above, according to this embodiment, since the Pv region can be evaluated by a simple method, and acceptance or rejection of the crystal and the growing condition of the crystal grown after corresponding crystal can be determined, a single crystal silicon wafer that does not include the COPs and the dislocation clusters can be stably manufactured without using the OSF region where an influence on an electronic device in the future is anticipated as an index.

Next, a second embodiment of the invention will be described. This embodiment relates to a method of pulling-up a crystal not including a COP region, an OSF region, a dislocation cluster, and a Pv region, that is, a non-defect crystal including only a Pi region.

FIG. 6A is a diagram illustrating another example of a relationship between a pulling-up velocity V of a silicon single crystal ingot 20 and kinds and distributions of defects. FIGS. 6B to 6D are cross-sectional views taken along the lines b4-b4, c4-c4, and d4-d4 of FIG. 6A, respectively. The defect distributions illustrated in FIG. 6A are obtained by performing a pulling-up velocity change experiment where the pulling-up velocity is gradually decreased. A pulling-up condition of FIG. 6A is set to Gc/Ge≥1, when a central portion of pulling-up single crystal is disposed in a temperature range from a melting point to 1370° C., a temperature gradient in the central portion is defined as Gc, and a temperature gradient in an outer circumferential portion is defined as Ge.

As apparent from FIG. 6A, in order to pull up a crystal that does not include the COP region 41, the OSF region 42, and the dislocation clusters 45, the pulling-up velocity needs to be set to a velocity not lower than V1 and not higher than V3. That is, if the pulling-up velocity is set to a velocity not lower than V1 and not higher than V3, the pulled-up crystal becomes a non-defect crystal of only the Pv region 43 and the Pi region 44. In order to pull up the crystal that does not include the COP region 41, the OSF region 42, the dislocation clusters 45, and the Pv region 43, that is, the non-detect crystal of only the Pi region 44, the pulling-up velocity needs to be set to a velocity not lower than V1 and not higher than V2. In this case, the non-defect does not mean that a defect does not exist including a shoulder portion or a tail portion, but means that a defect does not exist over substantially the entire length of a straight trunk obtained under the stable pulling-up condition.

In this way, in order to pull up the non-defect crystal of only the Pi region 44, the pulling-up velocity may be set to be the velocity not lower than V1 and not higher than V2. However, as described above, since the hot zone is temporally varied, the pulling-up velocities V1 and V2 are not given as absolute values but are given as relative values according to the variation in the hot zone. Accordingly, in order to pull up the non-defect crystal of only the Pi region 44, the crystal that has the defect distributions illustrated in FIG. 6A may be pulled up by performing the pulling-up velocity change experiment, the pulling-up velocities V1 and V2 may be calculated by referencing the result of the experiment, and the actual pulling-up velocities may be set to V1 and V2.

After the pulling-up velocities are set to V1 and V2 and pulling-up is performed, it is necessary to determine whether or not the current pulling-up velocity is proper by evaluating the actually pulled-up crystal, and perform a feedback with respect to the subsequent batch, which will be descried in detail below.

First, if the pulling-up velocity V is set to a velocity corresponding to the line b4-b4, as illustrated in FIG. 6B, a Pv region 43a having a disk shape appears in the central portion of the sliced silicon wafer 40 (evaluation sample), and a Pv region 43b having a ring shape appears in an outer circumferential portion. A toroidal region between the Pv region 43a and the Pv region 43b is a Pi region 44. In this case, the Pv region 43a having a disk shape has a diameter D7 and the Pv region 43b having a ring shape has a width W6. The method of distinguishing the Pv region and the Pi region is as described above. In this way, when the silicon wafer 40 is in a state illustrated in FIG. 6B, it can be determined that the pulling-up velocity exceeds V2. Accordingly, in this case, it can be seen that the pulling-up velocity V needs to be decreased by the control device 23.

If the pulling-up velocity V is set to the velocity corresponding to the line c4 to c4, as illustrated in FIG. 6C, the Pv region 43a having a disk shape appears in the central portion of the sliced silicon wafer 40, and the Pv region 43b having a ring shape appears in the outer circumferential portion. A toroidal region between the Pv region 43a and the Pv region 43b is a Pi region 44. However, the Pv region 43a having a disk shape has a diameter D8 that is smaller than the diameter D7 of the Pv region 43a illustrated in FIG. 6B (D8<D7). The Pv region 43b having a ring shape has a width W7 that is smaller than the width W6 of the Pv region 43b illustrated in FIG. 6B (W7<W6). Accordingly, even in this case, it can be determined that the pulling-up velocity exceeds V2. However, since the diameter of the Pv region 43a having a disk shape and the width of the Pv region 43b having a ring shape are further decreased, it can be seen that the pulling-up velocity is further approximated to V2, as compared with the case illustrated in FIG. 6B.

In this way, when the pulling-up velocity is V2 or more, the decrease amount of the pulling-up velocity V by the control device 23 can be determined according to the diameter of the Pv region 43a having a disk shape and the width of the Pv region 43b having a ring shape.

If the pulling-up velocity V is set to the velocity corresponding to the line d4 to d4, as illustrated in FIG. 6D, the entire sliced silicon wafer 40 becomes the Pi region 44. In this case, it can be determined that the pulling-up velocity is not lower than V1 and not higher than V2. Accordingly, the pulling-up velocity V does not need to be changed by the control device 23.

However, if the pulling-up velocity is decreased to be lower than V1, as displayed by the line X-X in FIG. 6A, the corresponding region may become a crystal region where the dislocation clusters 45 are included. Since the crystal is not accepted as a crystal of a silicon wafer for an IC device, the pulling-up velocity V needs to be increased by the control device 23.

Figure 16:
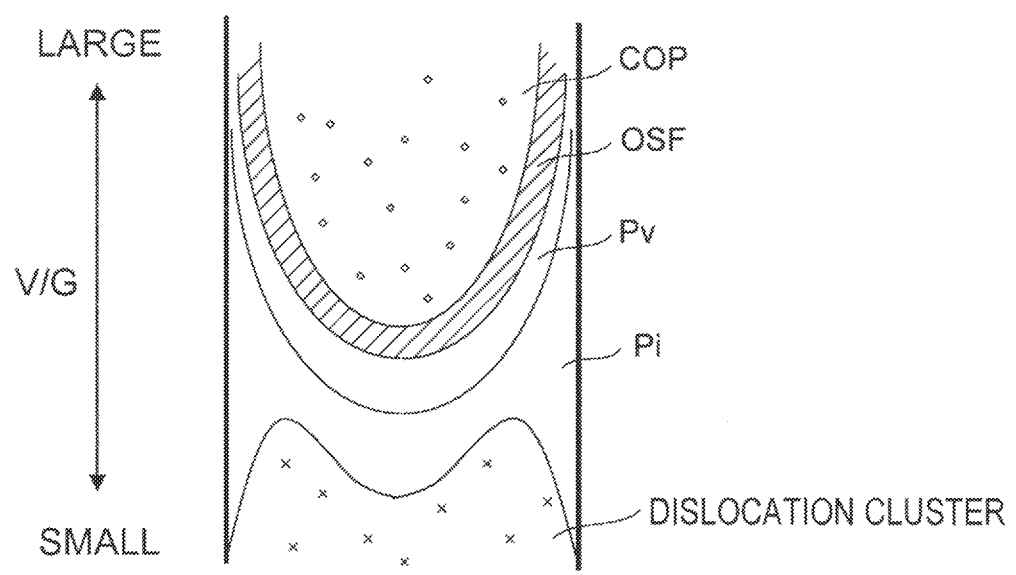
FIG. 16 is a diagram illustrating a general relationship between V/G and kinds and distributions of defects.

In FIGS. 6A to 6D, the pulling-up condition is set to Gc/Ge≥1, which is not essential in the invention. However, if the pulling-up condition is set to Gc/Ge≥1, as illustrated in FIG. 6A, the bottom portion of the OSF region 42 is planarized. As a result, a velocity range of V1 to V3 where the non-defect crystal is obtained is extended, and consequently a velocity range of V1 to V2 where the crystal only in the Pi region is obtained is extended. Meanwhile, when the pulling-up condition is set to Gc/Ge<1, as illustrated in FIG. 16, the bottom portion of the OSF region 42 becomes a U-shape, and the velocity range where the OSF region 42 is included may be extended. As a result, the velocity range of V1 and V2 becomes smaller, and may not exist in some cases. In consideration with these points, it is preferred that the pulling-up condition is set to Gc/Ge≥1. The temperature gradients Ge and Gc may be adjusted by adjusting the hot zone structure in the furnace (such as a shape of the heat shielding member 22 illustrated in FIG. 1 and a distance between the surface of the silicon melt 21 and the heat shielding member 22).

As described above, if the shape of the Pv region 43 is observed, it can be determined whether the current pulling-up velocity V is appropriate or not. When the pulling-up velocity is excessively high, it can be determined how much the amount of the pulling-up velocity should be decreased. When the pulling-up condition for the first pulling-up is determined, the crystal is preferably grown in the crystal region that includes at least the Pv region 43 and the Pi region 44. This is because that, as illustrated in FIGS. 6B and 6C, if the crystal region includes the Pv region 43 and the Pi region 44, it can be easily determined how much the amount of the pulling-up velocity should be adjusted on the basis of the diameter of the Pv region 43a having a disk shape or the width of the Pv region 43b having a ring shape.

In FIGS. 6A to 6D, the evaluation sample that is obtained by slicing the silicon single crystal ingot 20 in a radial direction is used, but an evaluation sample that is obtained by slicing the silicon single crystal ingot 20 in an axial direction may also be used. In the former case, a variation in defect distributions of a crystal pulling-up axial direction can be confirmed by slicing plural samples at a predetermined interval in the crystal pulling-up axial direction. In the latter case, defect distributions of the crystal pulling-up axial direction can be confirmed by producing plural samples continuous in an axial direction.

During the evaluation process, the region where the protrusion is formed includes the OSF region 42 or the COP region 41 as well as the Pv region 43. In other words, it is difficult to directly determine whether the region where the protrusion is formed is the Pv region 43, or the OSF region 42 or the COP region 41. However, since the object of this embodiment is to pull-up the silicon single crystal ingot under the condition where the protrusion is not formed, the protrusion should be removed regardless of its generation region. Specifically, as illustrated in FIG. 6A, the Pv region 43, the OSF region 42, and the COP region 41 that are the regions where the protrusion is formed are generated in a region of velocities that are higher than the pulling-up velocity where the Pi region 44 is obtained. Therefore, when the protrusion is observed, it can be seen that the pulling-up velocity may be decreased.

However, as illustrated in FIG. 6A, when the pulling-up velocity is lower than Vi, the dislocation clusters 45 may be included in the grown crystal. Since the protrusion is not generated by the RIE, the dislocation clusters 45 and the Pi region 44 cannot be distinguished during the evaluation process. However, the boundary between the Pi region 44 and the dislocation clusters 45 are subjected to an etching process, such as normal Secco etching in an evaluation sample, thereby simply confirming the dislocation cluster generation region at a visible level.

As described above, according to this embodiment, the pulling-up velocity is controlled to obtain the crystal where the protrusion is not generated when the RIE is performed on the evaluation sample in an as-grown state. As a result, a silicon single crystal that has an extremely small oxygen precipitate can be grown. Accordingly, the grown silicon single crystal ingot can be properly used for a vertical silicon device, such as an IGBT.

As described above, the preferred embodiments of the invention have been described, but the invention is not limited to the preferred embodiments, and it goes without saying that various changes and modifications can be made without departing from the sprit and scope of the invention.

For example, in the second embodiment, the case where the Pv region is excluded by controlling the pulling-up velocity has been exemplified. However, in the extremely low oxygen crystal, even in the Pv region, the protrusion may not be generated by the RIE. In such a case, since the Pv region and the Pi region can be regarded as the same region, the Pv region does not need to be excluded. That is, in the invention, the Pv region is not necessarily excluded, and it is acceptable if the protrusion is not formed in the case where the RIE is performed in the as-grown state.

Hereinafter, examples of the invention will be described, but the invention is not limited to the examples.

EXAMPLE 1

In the example 1, a relationship between a region where OSFs are generated and a region where a protrusion is detected by an RIE method is examined.

First, polycrystalline silicon chunks are put in a quartz crucible, and the polycrystalline silicon chunks are heated in an argon atmosphere to produce a silicon melt. Then, a single crystal that has a diameter of 305 mm and a crystal orientation of (100) is pulled up at a constant velocity, for example, an average pulling-up velocity of 0.50 mm/min, thereby growing a silicon single crystal ingot that does not include COPs and a dislocation clusters and has a diameter of 305 mm. When an interstitial oxygen concentration is measured by an FT-IR method (ASTM F121-79), a measurement result is $9 \times 10^{17}$ atoms/cm$^3$ to $11 \times 10^{17}$ atoms/cm$^3$.

Figure 7:
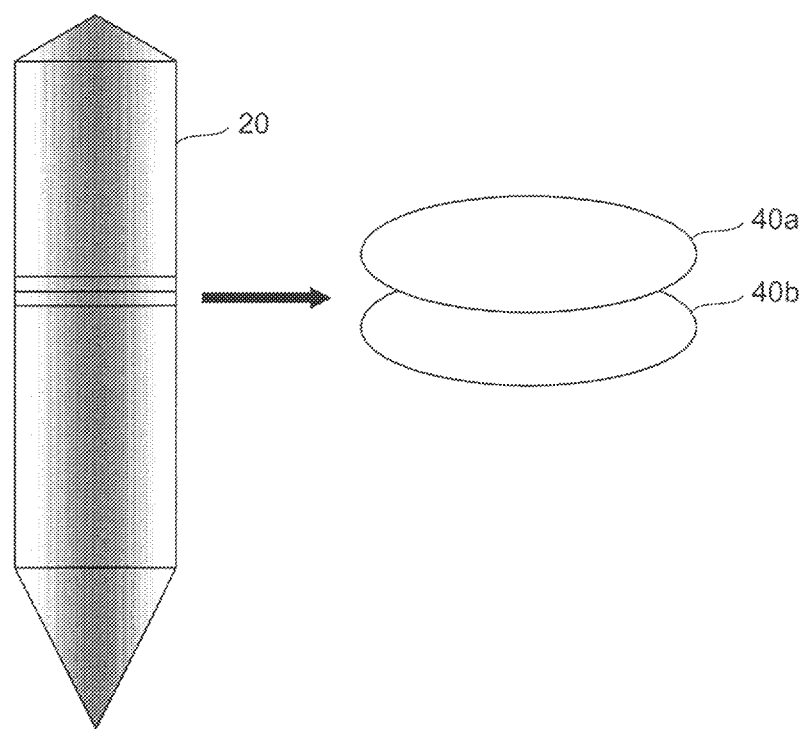
FIG. 7 is a schematic diagram illustrating slicing positions of wafers 40a and 40b used in an example 1.

Next, as illustrated in FIG. 7, two wafers 40a and 40b are sliced from adjacent positions of the grown silicon single crystal ingot 20, and mirror polishing is performed on the two wafers. Since the two wafers 40a and 40b are sliced from the adjacent positions, the defect distributions or the defect densities are regarded equal. In one wafer 40a, reactive ion etching is performed under the condition where a selected ratio of $Si/SiO_2$ is high (that is, $SiO_2$ is difficult to be etched) in an as-grown state. Under the condition where the atmosphere of the RIE is set as $HBr/Cl_2/He+O_2$ mixed gas, and a selected ratio of $Si/SiO_2$ becomes 100 or more, approximately 5 µm etching is performed. After the RIE, a cleaning process is executed using a hydrofluoric-acid aqueous solution to remove a reactive product attached at the time of the RIE, a surface etched by the RIE is evaluated by a visual observation and an observation using an optical microscope, under a convergent light, and a width of a region where the protrusion is generated by the RIE is measured.

The one remaining wafer 40b is subject to heat treatment at a temperature of 1000° C. for 3 hours in an oxygen atmosphere and heat treatment at a temperature of 1150° C. for 2 hours in an oxygen atmosphere containing water vapor. After an oxide film is removed using a hydrofluoric-acid aqueous solution, selective etching is performed using a Write solution, an etched surface is evaluated by a visual observation and an observation using an optical microscope, under a convergent light, and a width of a region where the protrusion is generated by the RIE is measured.

If the evaluation results of the two wafers 40a and 40b are compared with each other, it is revealed that a region where a protrusion is generated by the RIE is a region ranging from the center to 7 cm and a region where the OSFs are generated is a region ranging from the center to 3.5 cm, and the region where the protrusion is generated by the RIE is wider than the region where the OSFs are generated. This means the following fact. In the RIE method, the OSF nuclei (platelet oxygen precipitate) and the minute oxygen precipitation nuclei that are included in the Pv region adjacent to the OSF region can be detected as the protrusion. In addition, if the width of the region where the protrusion is generated is used as an index and acceptance or rejection of the crystal and a growing condition of crystal grown after the corresponding crystal is determined, crystal that does not include the COPs, the OSFs, and the dislocation clusters can be stably manufactured.

EXAMPLE 2

In the example 2, a difference of pretreatment of a sample where the RIE is performed is examined.

Figure 8:
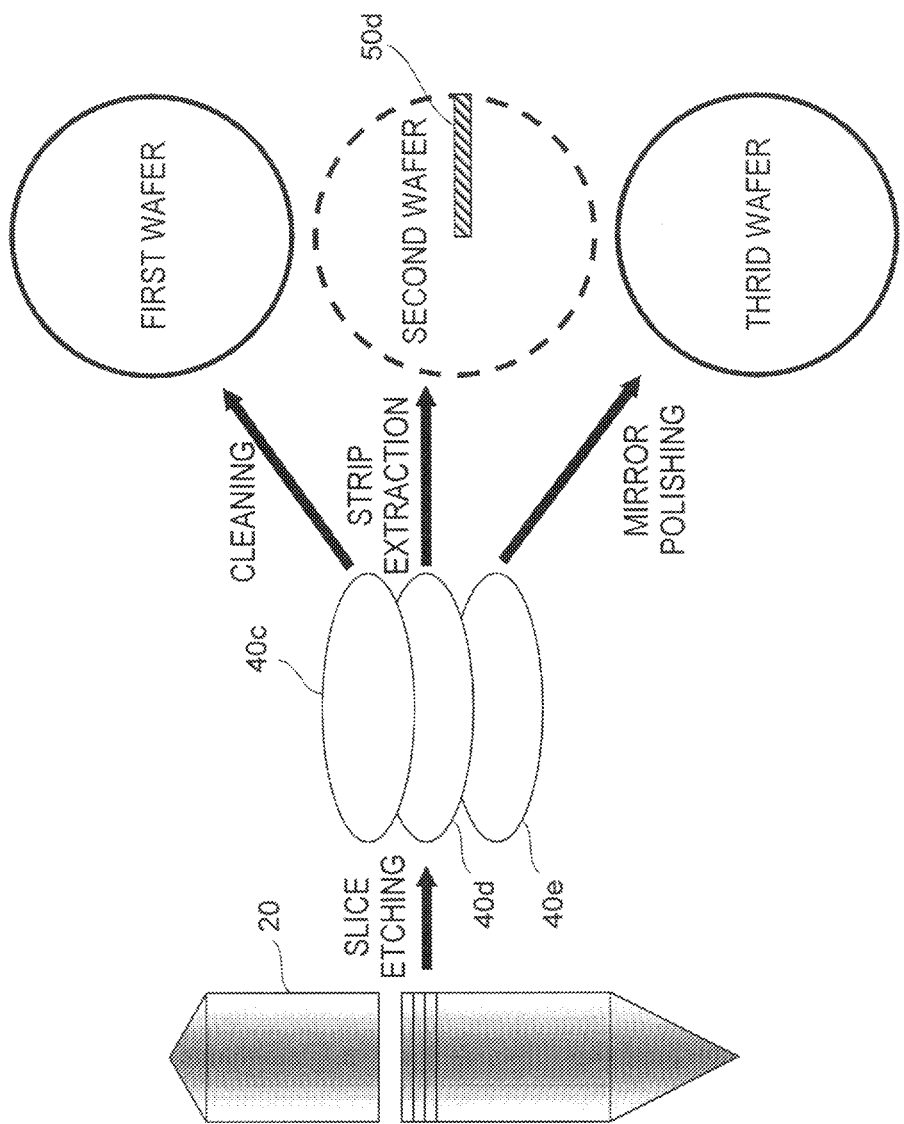
FIG. 8 is a schematic diagram illustrating slicing positions of wafers 40c to 40e used in an example 2.

First, from the positions where the two wafers 40a and 40b are sliced in the example 1, as illustrated in FIG. 8, three wafers 40c to 40e are further sliced. Since the three wafers 40c to 40e are sliced from adjacent positions, it may be determined that the defect distributions or the defect densities are the same. In addition, in order to remove a processing strain and smooth a surface, etching is performed on the three wafers using a mixed solution containing hydrofluoric acid and nitric acid.

Figure 9:
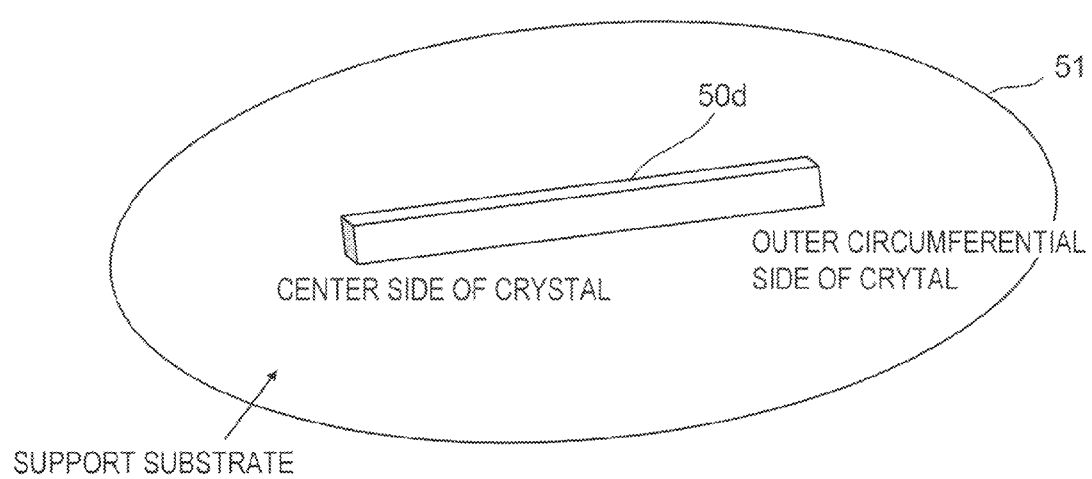
FIG. 9 is a schematic perspective view illustrating a state where a strip 50d used in an example 2 is attached to a support substrate 51.

In one wafer 40c, SC-1 cleaning (cleaning using a mixed solution of ammonia water, hydrogen peroxide water, and water) is performed, and attached foreign materials are removed. The cleaning for removing the attached foreign materials does not need to be limited to the SC-1 cleaning, and any cleaning that can remove the attached foreign materials may be used. The second wafer 40d is first cleaved in two portions. A portion at a position that is about 5 mm apart from a cleavage surface of the cleaved wafer is sliced by a dicing saw to be parallel to the cleavage surface, and a strip having a width of 5 mm is produced. A central portion of the strip in a length direction is sliced by the die saw, and a strip 50d having a length of about 150 mm is produced. Accordingly, in the strip 50d, a portion that ranges from the center of the crystal to the outer circumference is included. The strip 50d that is produced in such a way is subjected to the SC-1 cleaning to remove the attached foreign materials. The cleaning for removing the attached foreign materials does not need to be limited to the SC-1 cleaning, and any cleaning that can remove the attached foreign materials may be used. A surface that is opposite to the cleavage surface (surface sliced by the die saw) is bonded to a support substrate 51 having a diameter of 300 mm using a resist (refer to FIG. 9). A material that is used to bond the strip 50d may be a material other than the resist, and may be a material resistant to processes such as the hydrofluoric-acid cleaning, and the SC-1 cleaning. In the invention, after the strip 50d is cleaned, the strip 50d is bonded to the support substrate 51. However, after the strip 50d is bonded to the support substrate 51, the strip 50d and the support substrate 51 may be cleaned together. In the third wafer 40e, mirror polishing is performed.

With respect to the three samples where the above process is executed, reactive ion etching is performed under the condition where a selected ratio of $Si/SiO_2$ is high (that is, $SiO_2$ is difficult to be etched). Under the condition where an atmosphere of the RIE is set as $HBr/Cl_2/He+O_2$ mixed gas and a selected ratio of $Si/SiO_2$ is set to 100 or more, approximately 5 µm etching is preferably performed. After the RIE, a cleaning process is preferably executed using a hydrofluoric-acid aqueous solution to remove a reactive product attached at the time of the RIE. A surface etched by the RIE is evaluated by a visual observation and an observation using an optical microscope, under a convergent light, and the width of the region where the protrusion is generated by the RIE is measured.

Figure 10:
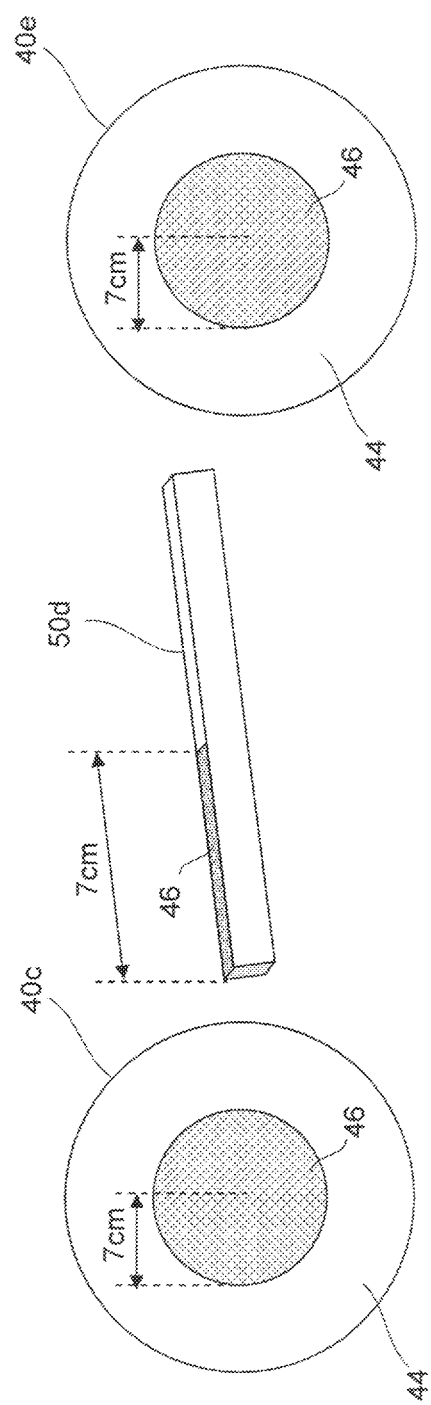
FIG. 10 is a schematic diagram illustrating an evaluation result in an example 2.

As a result, as illustrated in FIG. 10, in the first wafer 40c and the third wafer 40e, a region 46 where the protrusion is generated is formed in a disk shape having a radius of 7 cm. However, in the first sample where the mirror polishing is not performed, a protrusion that is generated presumably due to disturbance from the distributions is observed. Since the crystal defects are distributed in a concentric fashion, the protrusion that is not distributed in the concentric fashion can be easily generated presumably due to the disturbance. In the etched cleavage surface of the second strip-shaped sample 50d, a protrusion is generated in a range of 7 cm from the center of the crystal, and the protrusion is not generated at the outer circumferential side of the crystal. As described above, the width of the region where the protrusion is generated by the RIE is the same among the three samples. Therefore, it is revealed that, even in a surface where an SC-1 cleaning is performed by etching using a solution containing hydrofluoric acid and nitric acid or a surface that is cleaved and subjected to the SC-1 cleaning, not the mirror surface, the width of the region where the protrusion due to the defect is generated by the RIE can be evaluated.

As the examination result, the inventors have discovered that the wafers for defect evaluation are sliced at the predetermined intervals from the pulled-up crystal, the RIE is performed on the cleaved sample or the sample where the etching is performed for the processing distortion removal and the planarization, the Pv region can be exposed as the protrusion visually observed and observed by an optical microscope, under a convergent light, and if the width of the region where the protrusion is generated is used as an index and acceptance or rejection of the crystal and a growing condition of crystal grown after the corresponding crystal is determined, crystal that does not include the COPs, the OSFs, and the dislocation clusters can be stably manufactured.

EXAMPLE 3

In the example 3, silicon single crystal is grown using three hot zones where radial distributions of the temperature gradient G are different from each other and an evaluation is performed.

First, three silicon single crystals are produced using three hot zones (HZ-1, HZ-2, and HZ-3) where radial distributions of the temperature gradient G are different from each other. Specifically, polycrystalline silicon chunks are put in a quartz crucible, and the polycrystalline silicon chunks are heated in an argon atmosphere to produce a silicon melt. Then, single crystal that has a diameter of 305 mm and a crystal orientation of (100) is pulled up at a constant velocity, for example, an average pulling-up velocity of 0.50 ram/min. After the pulled-up crystal is polished in a cylinder having a diameter of about 301 mm, wafers having surfaces almost vertical to a growth axis are sliced by fives at an interval between about 50 mm, all the wafers are immersed in a mixed solution of hydrofluoric acid and nitric acid to be etched, and a processing damage layer that is generated at the time of slicing is removed. Since the five wafers are sliced from the adjacent positions, the defect distributions can be regarded as being equal to each other. When an interstitial oxygen concentration is measured by an FT-IR method (ASTM F121-79), a measurement result is $9 \times 10^{17}$ atoms/cm$^3$ to $11 \times 10^{17}$ atoms/cm$^3$.

With respect to all portions of the crystal, first, the COPs and the dislocation clusters are evaluated. Among the wafers that are sliced by fives from each part, each wafer is cleaved into two portions, and an evaluation of the COPs is performed in one part and an evaluation of the dislocation clusters are performed in the remaining part. The evaluation of the COPs is performed using an infrared tomography and the evaluation of the dislocation clusters is performed using Secco etching. Among the remaining wafers that are sliced from each part where the COPs and the dislocation clusters are not detected, the wafer that is the wafer pulled up by HZ-1 and corresponds to a part where the COPs and the dislocation clusters are not detected is set as "sample 1", the wafer that is the wafer pulled up by HZ-2 and corresponds to a part where the COPs and the dislocation clusters are not detected is set as "sample 2", and the wafer that is the wafer pulled up by HZ-3 and corresponds to a part where the COPs and the dislocation clusters are not detected is set as "sample 3". Since the portions where the COPs and the dislocation clusters are not detected are plural, the wafers of the samples 1 to 3 exist by plural sets, each of which includes four wafers.

Evaluation of Sample 1

Four sets of samples 1A to 1D are produced from the wafer of the sample 1. As described above, the wafer of the sample 1 is the wafer that is pulled up by the HZ-1 and corresponds to the part where the COPs and the dislocation clusters are not detected.

The sample 1A of the first set is a sample where etching using a mixed solution of hydrofluoric acid and nitric acid is additionally performed on the wafer of the sample 1 to further smooth the surface of the wafer, and the attached foreign materials are removed by the SC-1 cleaning (cleaning using a mixed solution of ammonia water, hydrogen peroxide water, and water). In the sample 1A, the mixed solution of the hydrofluoric acid and the nitric acid is used to smooth the surface of the wafer, but other material (for example, acetic acid) may be added. In the sample 1A, the SC-1 cleaning is performed to remove the attached foreign materials. However, the cleaning does not need to be limited to the SC-1 cleaning, and any cleaning that can remove the attached foreign materials may be used.

When the sample 1B of the second set is produced, the wafer of the sample 1 is cleaved into two portions. A portion at a position that is about 5 mm apart from a cleavage surface of the cleaved wafer is sliced by a dicing saw to be parallel to the cleavage surface, and thereby a strip having a with of 5 mm is produced. A central portion of the strip in a longitudinal direction is sliced by the die saw, and a strip having a length of about 150 mm is produced. Accordingly, in the strip, a portion that ranges from the center of the crystal to the outer circumference is included. The strip that is produced in the above-described way is subjected to the SC-1 cleaning to remove the attached foreign materials. In the sample 1B, the SC-1 cleaning is performed to remove the attached foreign materials. However, the cleaning does not need to be limited to the SC-1 cleaning, and any cleaning that can remove the attached foreign materials may be used. A surface that is opposite to the cleavage surface (surface sliced by the die saw) is bonded to a support substrate (silicon wafer is used in the sample 1B) having a diameter of 300 mm using a resist. In the sample 1B, the resist is used to bond the strip to the support substrate. However, a material other than the resist may be used. For example, a material resistant to processes of the RIE, the hydrofluoric-acid cleaning, and the SC-1 cleaning may be used. In the sample 1B, after the strip is cleaned, the strip is bonded to the support substrate. However, after the strip is bonded to the support substrate, the strip and the support substrate may be cleaned together.

The sample 1C of the third set is a sample where the mirror polishing is performed on the wafer of the sample 1.

The sample 1D of the fourth set is a sample where heat treatment at a temperature of 1000° C. for 3 hours in an oxygen atmosphere and heat treatment at a temperature of 1150° C. for 2 hours in an oxygen atmosphere containing water vapor are performed on the wafer of the sample 1.

Next, with respect to the samples 1A to 1C of the first to third sets, reactive ion etching (RIE) is performed under the condition where a selected ratio of Si/SiO$_2$ is high (that is, SiO$_2$ is difficult to be etched). Under the condition where the atmosphere of the RIE is set as HBr/Cl$_2$/He+O$_2$ mixed gas, and a selected ratio of Si/SiO$_2$ becomes 100 or more, approximately 5 µm etching is performed. After the RIE, a cleaning process is executed using a hydrofluoric-acid aqueous solution to remove a reactive product attached at the time of the RIE, a surface etched by the RIE is evaluated by a visual observation and an observation using an optical microscope, under a convergent light, and a width of a region where the protrusion is generated by the RIE is measured.

Meanwhile, with respect to the sample 1D of the fourth set, after an oxide film is removed using a hydrofluoric-acid aqueous solution, selective etching is performed using a Write solution, an etched surface is evaluated by a visual observation and an observation using an optical microscope, under a convergent light, and a width of a region where the OSFs are generated is measured.

First, a generation status of the OSFs that are evaluated using the sample 1D will be described. In the crystal that is pulled up by the HZ-1, there are a sample where the OSFs are not generated and a sample where the OSFs are generated in a disk shape. The result indicates that a V/G of an approximately central portion of the crystal is larger (that is, G is small) than that in an outer circumferential portion thereof in the HZ-1 (for example, refer to FIGS. 2A to 2D).

Next, a generation status of the protrusion after the RIE is performed on the samples 1A to 1C will be described. In the samples 1A and 1C, the protrusion is generated in a disk shape. However, in the sample 1A where the mirror polishing is not performed, a protrusion that is generated presumably due to disturbance from the distributions is observed. Since the crystal defects are distributed in a concentric fashion, the protrusion that is not distributed in the concentric fashion can be easily generated presumably due to the disturbance. In the etched cleavage surface of the sample 1B, a protrusion is generated at the center side of the crystal, and the protrusion is not generated at the outer circumferential side of the crystal.

Figure 11:
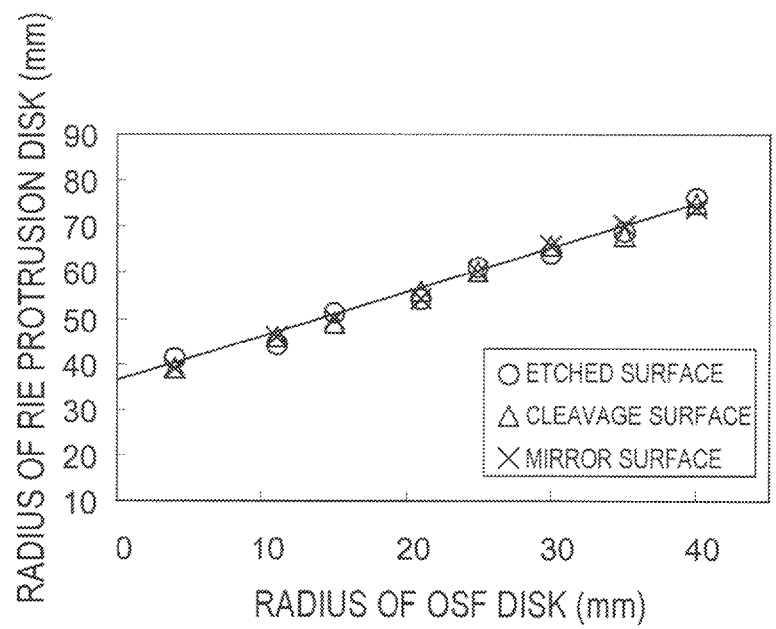
FIG. 11 is a graph illustrating an evaluation result of a sample 1 in an example 3.

FIG. 11 illustrates a state where the radius of the region where the protrusions are generated in the samples 1A and 1C and the length (that is, radius) of a range where the protrusion is generated in the sample 1B are plotted with respect to the radius of the region where the OSFs are generated. The radius of the region where the OSFs are generated is a value that is obtained from the sample 1D.

As illustrated in FIG. 11, it is confirmed that the radii of the ranges where the protrusions are generated in the samples 1A to 1C are almost identical, and are approximately 3.5 cm larger than the radius of the range where the OSFs are observed in the sample 1D. This result suggests the following two points. First, even in a surface that is smoothly etched using a mixed solution of hydrofluoric acid and nitric acid or the cleaved surface, the same evaluation (evaluation of the range where the protrusion is generated by the RIE) as that in the surface subjected to mirror polishing is possible. Second, the radius of the range where protrusion is generated by the RIE is necessarily larger than the radius of the range where the OSFs are generated, and a good correlation exists between them.

Accordingly, the radius of the range where the protrusion is generated by the RIE is used as an index and acceptance or rejection of the crystal and a growing condition of crystal grown after the corresponding crystal can be determined on the basis of the magnitude thereof. In the case of the sample 1, if the pulling-up velocity is set such that the radius of the region where the protrusion is generated by the RIE becomes 3.5 cm or less, crystal that does not include the COPs and the dislocation clusters can be pulled up. For example, when the temporal variation of the hot zone is generated and G is decreased (V/G is increased), the radius of the range where the protrusion is generated by the RIE is increased. Therefore, the variation in V/G due to the temporal variation in the hot zone can be detected. Next, if the pulling-up velocity is decreased and the crystal is pulled up, V/G can be returned to the original value, and crystal that does not include the OSF nuclei can be pulled up.

Evaluation of Sample 2

Four sets of samples 2A to 2D are produced from the wafer of the sample 2. As described above, the wafer of the sample 2 is the wafer that is pulled up by the HZ-2 and corresponds to the part where the COPs and the dislocation clusters are not detected.

The samples 2A to 2D are produced by the same method as that in the samples 1A to 1D.

First, a generation status of the OSFs that are evaluated using the sample 2D will be described. In the crystal that is pulled up by the HZ-2, there are a sample where the OSFs are not generated and a sample where the OSFs are generated in a disk shape and a ring shape near the center and near circumferential portion of the crystal. The result indicates that a V/G is large (that is, G is small) near the central portion and near circumferential portion of the crystal in the HZ-2 (for example, refer to FIGS. 3A to 3D).

Next, a generation status of the protrusion after the RIE is performed on the samples 2A to 2C will be described. In the samples 2A and 2C, the protrusion is generated in a disk shape and a ring shape near the central portion and near the outer circumferential portion of the crystal. However, in the sample 2A where the mirror polishing is not performed, a protrusion that is generated presumably due to disturbance from the distributions is observed. Since the crystal defects are distributed in a concentric fashion, the protrusion that is not distributed in the concentric fashion can be easily presumed as being generated due to the disturbance. In the etched cleavage surface of the sample 2B, a protrusion is generated at the center side of the crystal, and the protrusion is generated at the center side and the outer circumferential side of the crystal.

Figure 12:
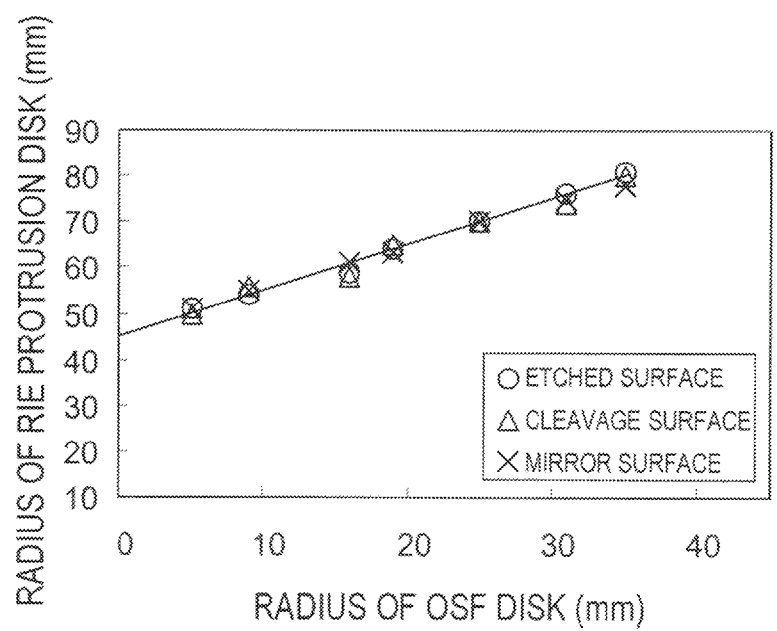
FIG. 12 is a graph illustrating an evaluation result of a sample 2 (disk region) in an example 3.

In this way, in the sample 2, the protrusions by the OSFs and the RIE are generated in a disc shape and a ring shape. First, with respect to the region where the defects are generated in a disc shape, a relationship between the protrusions by the OSFs and the RIE will be sorted out. FIG. 12 illustrates a state where the radius of the region where the protrusions are generated in a disc shape in the samples 2A and 2C and the length (that is, radius) of a range where the protrusion is generated at the center side of the crystal in the strip-shaped sample of the sample 2B are plotted with respect to the radius of the region where the OSFs are generated in a disc shape.

As illustrated in FIG. 12, it is confirmed that the radii of the ranges where the protrusions are observed in the samples 2A to 2C are almost identical, and are approximately 4.5 cm larger than the radius of the range where the OSFs are observed. This result suggests the following two points. First, even in a surface that is smoothly etched using a mixed solution of hydrofluoric acid and nitric acid or the cleaved surface, the same evaluation (evaluation of the range where the protrusion is generated by the RIE) as that in the surface subjected to mirror polishing is possible. Second, the radius of the range where protrusion is generated by the RIE is necessarily larger than the radius of the range where the OSFs are generated, and a good correlation exists between them. If the pulling-up velocity is set such that the radius of the disk-like region where the protrusion is generated by the RIE becomes 4.5 cm or less, crystal that does not include the COPs and the dislocation clusters near the central portion of the crystal can be pulled up.

Figure 13:
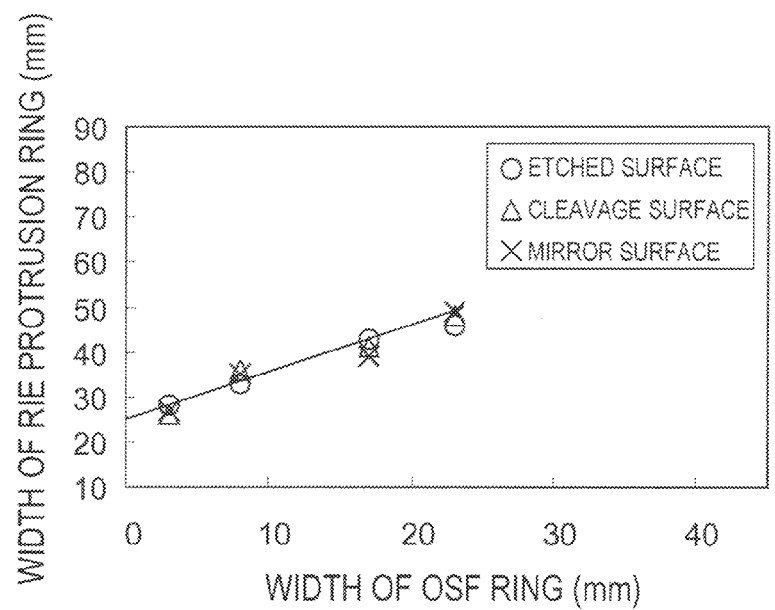
FIG. 13 is a graph illustrating an evaluation result of a sample 2 (ring region) in an example 3.

Next, with respect to the region where the defects are generated in a ring shape, a relationship between the protrusions by the OSFs and the RIE will be sorted out. FIG. 13 illustrates a state where the width of the region where the protrusions are generated in a ring shape in the samples 2A and 2C and the width of a range where the protrusion is generated at the outer circumferential side of the crystal in the strip sample of the sample 2B are plotted with respect to the width of the region where the OSFs are generated in a ring shape.

As illustrated in FIG. 13, it is confirmed that the widths of the ranges where the protrusions are observed in the samples 2A to 2C are almost identical, and are approximately 2.5 cm larger than the width of the range where the OSFs are observed. This result suggests the following two points. First, even in a surface that is smoothly etched using a mixed solution of hydrofluoric acid and nitric acid or the cleaved surface, the same evaluation (evaluation of the range where the protrusion is generated by the RIE) as that in the surface subjected to mirror polishing is possible. Second, the width of the range where protrusion is generated by the RIE is necessarily larger than the width of the range where the OSFs are generated, and furthermore a good correlation exists between them. If the pulling-up velocity is set such that the radius of the ring-like region where the protrusion is generated by the RIE becomes 2.5 cm or less, crystal that does not include the COPs and the dislocation clusters near the outer circumferential portion of the crystal can be pulled up.

Accordingly, the width of the range where the protrusion is generated by the RIE is used as an index and acceptance or rejection of the crystal and a pulling-up condition of crystal grown after the corresponding crystal can be determined on the basis of the magnitude thereof. In the case of the sample 2, if the pulling-up velocity is set such that the radius of the region where the protrusion is generated in a disc shape by the RIE becomes 4.5 cm or less and the radius of the region where the protrusion is generated in a ring shape by the RIE becomes 2.5 cm or less, crystal that does not include the COPs and the dislocation clusters over the entire wafer can be pulled up. For example, when the temporal variation of the hot zone is generated and G is decreased (V/G is increased), the radius of the region where the protrusion is generated by the RIE is increased. Therefore, the variation in V/G due to the temporal variation in the hot zone can be detected. Next, if the pulling-up velocity is decreased and the crystal is pulled up, V/G can be returned to the original value, and subsequently, crystal that does not include the OSF nuclei can be pulled up.

Evaluation of Sample 3

Four sets of samples 3A to 3D are produced from the wafer of the sample 3. As described above, the wafer of the sample 3 is the wafer that is pulled up by the HZ-3 and corresponds to the part where the COPs and the dislocation clusters are not detected.

The samples 3A to 3D are produced by the same method as that in the samples 1A to 1D.

First, a generation status of the OSFs that are evaluated using the sample 3D will be described. In the crystal that is pulled up by the HZ-3, there are a sample where the OSFs are not generated and a sample where the OSFs are generated in a ring shape near the outer circumferential portion of the crystal. The result indicates that a V/G is large (that is, G is small) in the outer circumferential portion of the crystal in the HZ-3 (for example, refer to FIGS. 4A to 4D).

Next, a generation status of the protrusion after the RIE is performed on the samples 3A to 3C will be described. In the samples 3A and 3C, the protrusion is generated in a ring shape near the outer circumferential portion of the crystal. However, in the sample 3A where the mirror polishing is not performed, a protrusion that is generated presumably due to disturbance from the distributions is observed. Since the crystal defects are distributed in a concentric fashion, the protrusion that is not distributed in the concentric fashion can be easily generated presumably due to the disturbance. In the etched cleavage surface of the sample 3B, a protrusion is generated at the outer circumferential side of the crystal.

Figure 14:
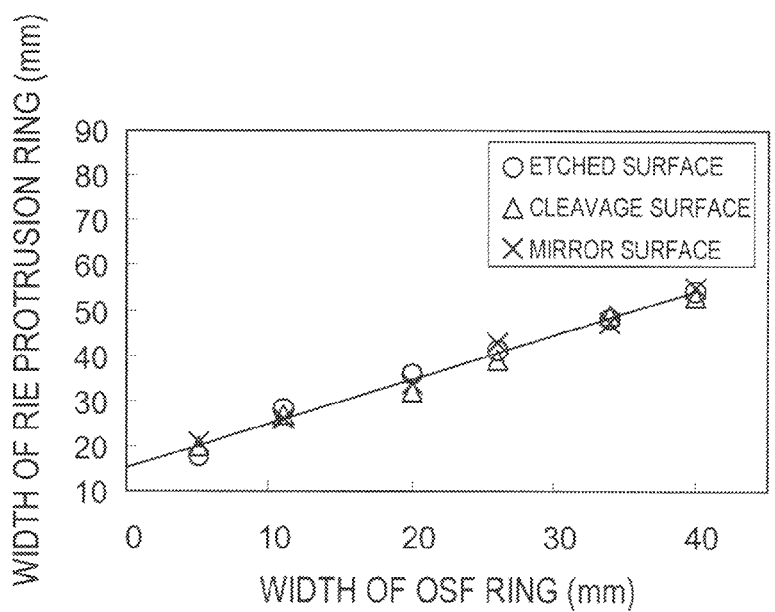
FIG. 14 is a graph illustrating an evaluation result of a sample 3 in an example 3.

In this way, in the sample 3, the protrusions by the OSFs and the RIE are generated in a ring shape. FIG. 14 illustrates a state where the width of the region where the protrusions are generated in a ring shape in the samples 3A and 3C and the width of a range where the protrusion is generated at the outer circumferential side of the crystal in the strip sample of the sample 3B are plotted with respect to the width of the region where the OSFs are generated in a ring shape.

As illustrated in FIG. 14, it is confirmed that the widths of the ranges where the protrusions are observed in the samples 3A to 3C are almost identical, and are approximately 1.5 cm larger than the radius of the range where the OSFs are observed. This result suggests the following two points. First, even in a surface that is smoothly etched using a mixed solution of hydrofluoric acid and nitric acid or the cleaved surface, the same evaluation (evaluation of the range where the protrusion is generated by the RIE) as that in the surface subjected to mirror polishing is possible. Second, the radius of the range where protrusion is generated by the RIE is necessarily larger than the radius of the range where the OSFs are generated, and a good correlation exists between them.

If the pulling-up velocity is set such that the width of the ring-like region where the protrusion is generated by the RIE becomes 1.5 cm or less, crystal that does not include the COPs and the dislocation clusters can be pulled up. That is, the width of the range where the protrusion is generated in a ring shape by the RIE is used as an index and acceptance or rejection of the crystal and a pulling-up condition of crystal grown after the corresponding crystal can be determined on the basis of the magnitude thereof. In the case of the sample 3, if the pulling-up velocity is set such that the width of the region where the protrusion is generated in a ring shape by the RIE becomes 1.5 cm or less, crystal that does not include the COPs and the dislocation clusters over the entire wafer can be pulled up. For example, when the temporal variation of the hot zone is generated and G is decreased (V/G is increased), the width of the range where the protrusion is generated by the RIE is increased. Therefore, the variation in V/G due to the temporal variation in the hot zone can be detected. Next, the crystal is pulled up after the pulling-up velocity is decreased, V/G can be returned to the original value, and crystal that does not include the OSF nuclei can be pulled up.

EXAMPLE 4

In the example 4, under the condition where the pulling-up apparatus illustrated in FIG. 1 is used, the central portion of the pulled-up single crystal is disposed in a temperature range from the melting point to 1370° C., the temperature gradient of a pulling-up axial direction of the single crystal is defined as Gc in the central portion and defined as Ge in the outer circumferential portion, and Gc/Ge becomes 1 or less, a pulling-up velocity change experiment is performed while the pulling-up velocity is gradually decreased, and two silicon single crystal ingots that include various crystal regions are grown. In this case, each of the grown ingots is a single crystal ingot that has an oxygen concentration: $12 \times 10^{17}$ atoms/cm$^3$, a single crystal diameter: 300 mm, a crystal orientation: <100>, a polarity: p type (boron dope), and single crystal straight trunk length: 2000 mm.

Between the grown single crystal ingots, one single crystal ingot is vertically divided, and an evaluation sample is produced. After the evaluation sample is subjected to oxygen precipitate evaluation heat treatment at a temperature of 800° C. for 4 hours and a temperature of 1000° C. for 16 hours in an oxygen atmosphere, a surface of the evaluation sample is decorated by copper, and subjected to heat treatment at a temperature of 1000° C. for one hour. In addition, after the heat treatment, the evaluation sample is subjected to selective etching using a Write solution and a pit that appears in the surface of the sample is observed by an optical microscope. As a result, it is confirmed that crystal region distributions illustrated in FIG. 6A are obtained.

With respect to the remaining single crystal ingot, among the crystal region distributions that are obtained from the observation result of the previously vertically divided evaluation sample and illustrated in FIG. 6A, a crystal region becoming the position of the line B-B, that is, as illustrated in FIG. 6B, a crystal region where the Pv region 43a exists in a disk shape at the central portion of the crystal, the Pi region 44 exists in a ring shape in the outside region of the Pv region 43a, and the Pv region 43b exists in the outer circumferential portion of the crystal in the outside region is sliced in a radial direction such that the sample wafer is obtained from the crystal region. As a result, the sample wafer where the Pv region 43a, the Pi region 44, and the Pv region 43b are mixed in the radial direction is sliced.

Under the same growing condition as that in the above-described case, two silicon single crystal ingots where oxygen concentrations are different from each other as $9 \times 10^{17}$ atoms/cm$^3$ and $5 \times 10^{17}$ atoms/cm$^3$ are grown, and the sample wafers are sliced from the height positions that become the same crystal regions as the previously produced sample wafers. That is, the same sample wafers are produced, except for the different oxygen concentrations.

Next, two evaluation processes (A) and (B) are performed on the sample wafers where the oxygen concentrations are different from each other, and the oxygen precipitate density distributions that are observed on the surfaces of the wafers are examined. The evaluation process (A) is an evaluation process based on oxygen precipitate evaluation heat treatment that is generally performed from the past, and the evaluation process (B) is an evaluation process based on an RIE process in the invention.

(A) Evaluation Based on the Oxygen Precipitate Evaluation Heat Treatment

Comparative Example

Each sample wafer is subjected to heat treatment at a temperature of 800° C. for 3 hours and at a temperature of 1000° C. for 16 hours in a dry oxygen atmosphere. Then, after an oxide film formed on a wafer surface is removed using a hydrofluoric-acid aqueous solution, the wafer surface is selectively etched using a Write solution. The etched wafer surface is evaluated by a visual observation and an observation using an optical microscope, under a convergent light, and a width of the region where the oxygen precipitate is generated on the wafer surface is measured. The measured result is schematically illustrated in FIGS. 15A to 15C. FIGS. 15A to 15C illustrate samples where oxygen concentrations are $12 \times 10^{17}$ atoms/cm$^3$, $9 \times 10^{17}$ atoms/cm$^3$, and $5 \times 10^{17}$ atoms/cm$^3$, respectively, and a hatched region is a region (Pv region) that is exposed as an oxygen precipitate and detected.

(B) Evaluation Based on the RIE Processing

Present Example

Each sample wafer is subjected to reactive ion etching under the condition where a selected ratio of Si and SiO$_2$ is high (that is, SiO$_2$ is difficult to be etched), and a protrusion having a conical shape that is generated due to a defect including silicon oxide is formed on the wafer surface. Under the condition where the atmosphere of the RIE comprises HBr/Cl$_2$/He+O$_2$ mixed gas, and a selected ratio of Si/SiO$_2$ becomes 100 or more, approximately 5 µm etching is performed. Then, after a reactive product attached at the time of the RIE is cleaned and removed using a hydrofluoric-acid aqueous solution, the etched wafer surface is evaluated by a visual observation and an observation using an optical microscope, under a convergent light, and the width of the generation region of the protrusion that is formed on the wafer surface is measured. Evaluation photos at the time of visual observation under a convergent light are illustrated in FIGS. 15D to 15F. FIGS. 15D to 15F illustrate samples where oxygen concentrations are $12 \times 10^{17}$ atoms/cm$^3$, $9 \times 10^{17}$ atoms/cm$^3$, and $5 \times 10^{17}$ atoms/cm$^3$, and a region where a white region on the colored background corresponds to a region (Pv region) where a protrusion exists.

Evaluation Result

When the evaluation is performed using the evaluation process (A), as compared with the sample wafer where an oxygen concentration is $12 \times 10^{17}$ atoms/cm$^3$, in a sample wafer where an oxygen concentration is $9 \times 10^{17}$ atoms/cm$^3$, a phenomenon where the width of the region detected as the oxygen precipitate region is reduced is observed. If the oxygen concentration is reduced to $5 \times 10^{17}$ atoms/cm$^3$, the oxygen precipitate is not observed on the entire wafer surface.

Meanwhile, although when the evaluation is performed using the evaluation process (B), a slight difference exists in an oxygen precipitate density, even though the oxygen concentration is $9 \times 10^{17}$ atoms/cm$^3$ or $5 \times 10^{17}$ atoms/cm$^3$, the protrusion is observed with the same defect distribution width as the sample wafer where the oxygen concentration is $12 \times 10^{17}$ atoms/cm$^3$.

This means that the oxygen precipitate distribution is varied in the evaluation process (A) according to the decrease in the oxygen concentration of the single crystal ingot, and the evaluation process (B) can detect the oxygen precipitate not detected in the evaluation process (A). Accordingly, if the evaluation is performed using the evaluation process (B) and the growing condition (pulling-up velocity and/or temperature gradient) is adjusted to become a crystal region not detected as the protrusion, a silicon single crystal ingot where a minute oxygen precipitate having a concern of affecting a device is excluded can be grown.

EXAMPLE 5

In the example 5, even when the defect evaluation using the RIE method is performed, an experiment of growing a single crystal where the protrusion is not detected and the COPs and the dislocation clusters do not exist is performed.

First, a pulling-up velocity where the crystal region where the protrusion is not detected is obtained is calculated on the basis of the evaluation result of the evaluation process (B) obtained in the example 4, and the pulling-up velocity is adjusted. The other growing condition is the same as that in the example 4. In this case, the silicon single crystal where an oxygen concentration is $6 \times 10^{17}$ atoms/cm$^3$ is grown.

Next, from the position that is 100 mm apart downward from the top position of the grown single crystal ingot straight trunk and the position that is 200 mm apart upward from the bottom position of the grown single crystal ingot straight trunk, the sample wafers are sliced in a radial direction.

In addition, with respect to both the sample wafers, the evaluation process is performed under the same condition as the evaluation process (B) of the example 5. As a result, in both the sample wafers, the protrusion that is distributed concentrically at the central portion of the crystal is not observed.

What is claimed is:
1. A method of manufacturing a silicon single crystal, the method comprising:
   growing a first silicon single crystal ingot including neither a COP nor a dislocation cluster by a Czochralski method;

slicing a silicon wafer from the first silicon single crystal ingot;

performing reactive ion etching on the silicon wafer in an as-grown state to expose a grown-in defect including silicon oxide as a protrusion on an etching surface, wherein a generation region of the exposed protrusion is a Pv region which includes an oxygen precipitation nucleus in an as-grown state; and thereafter growing a subsequent silicon single crystal ingot wherein a growing condition of the growing of the subsequent silicon single crystal ingot is adjusted on a basis of a radius of the generation region of the exposed protrusion.

2. The method as claimed in claim 1, wherein an acceptance or a rejection of the first silicon single crystal ingot is determined on the basis of the generation region of the exposed protrusion.

3. The method as claimed in claim 1, wherein the growing of the first silicon single crystal ingot creates an ingot which does not include OSF regions.

4. The method as claimed in claim 1, wherein performing the reactive ion etching includes: etching the silicon wafer using an aqueous solution containing hydrofluoric acid and nitric acid; and performing the reactive ion etching on an etched surface.

5. The method as claimed in claim 1, wherein performing the reactive ion etching includes: cleaving the silicon wafer; and performing the reactive ion etching on a cleavage surface.

6. The method as claimed in claim 1, wherein performing the reactive ion etching includes: mirror polishing the silicon wafer; and performing the reactive ion etching on a mirror polished surface.

7. A method of manufacturing a silicon single crystal, comprising:

growing a first silicon single crystal ingot including neither a COP nor a dislocation cluster by a Czochralski method;

slicing an evaluation sample from the first silicon single crystal ingot;

performing a reactive ion etching on the evaluation sample in the as-grown state to expose a defect including silicon oxide as a protrusion, wherein a generation region of the exposed protrusion is a Pv region which includes an oxygen precipitation nucleus in an as-grown state; and adjusting a growing condition of a subsequently-grown silicon single crystal ingot on a basis of a radius of a generation region of the exposed protrusion exposed on the evaluation process, wherein the subsequently-grown silicon single crystal ingot is thereby pulled up under a condition where the protrusion is not formed on the surface of the evaluation sample.

8. The method as claimed in claim 7, wherein, in the growing of the first silicon single crystal ingot, when a temperature gradient in a central portion is defined as Gc and a temperature gradient in an outer circumferential portion is defined as Ge, the silicon single crystal ingot is grown under a condition of Gc/Ge≥1.

9. The method as claimed in claim 7, wherein an OSF does not exist in a region where the protrusion is not generated by performing the reactive ion etching.

10. The method as claimed in claim 7, wherein an oxygen concentration in the silicon single crystal is $9 \times 10^{17}$ atoms/cm$^3$ or less.

11. The method as claimed in claim 7, wherein the evaluation sample is obtained by slicing the silicon single crystal ingot in a radial direction or in an axial direction.

* * * * *